United States Patent
Yi et al.

(10) Patent No.: US 9,218,864 B1
(45) Date of Patent: Dec. 22, 2015

(54) MAGNETORESISTIVE RANDOM ACCESS MEMORY CELL AND 3D MEMORY CELL ARRAY

(71) Applicants: Ge Yi, San Ramon, CA (US); Dong Li, San Ramon, CA (US)

(72) Inventors: Ge Yi, San Ramon, CA (US); Dong Li, San Ramon, CA (US)

( * ) Notice: Subject to any disclaimer, the term of this patent is extended or adjusted under 35 U.S.C. 154(b) by 0 days.

(21) Appl. No.: 14/506,618

(22) Filed: Oct. 4, 2014

(51) Int. Cl.
*G11C 11/00* (2006.01)
*G11C 11/16* (2006.01)

(52) U.S. Cl.
CPC .......... *G11C 11/161* (2013.01); *G11C 11/1673* (2013.01); *G11C 11/1675* (2013.01)

(58) Field of Classification Search
USPC ........................................................ 365/158
See application file for complete search history.

(56) References Cited

U.S. PATENT DOCUMENTS

| | | | | |
|---|---|---|---|---|
| 8,711,608 B2 * | 4/2014 | Xi | ........................... | G11C 11/16 365/148 |
| 2008/0273380 A1 * | 11/2008 | Diao | ...................... | G11C 11/16 365/171 |
| 2013/0114334 A1 * | 5/2013 | Yi | ........................... | H01L 43/08 365/158 |

* cited by examiner

*Primary Examiner* — Hoai V Ho

(57) ABSTRACT

A novel three-terminal SOT-MRAM memory cell with a unique magnetic stabilization layer or structure is proposed. A complementary magnetic footprint of the data storage layer for the memory cell is able to be created within the magnetic stabilization layer or structure by the magnetic field from the storage layer to enhance the magnetic and thermal stability of the memory cell. Several designs for both perpendicular and in-plane SOT-MRAM memory cell have been invented. With proper wire connection and sensing arrangement, the proposed memory cell is capable of forming not only the 2D array but also 3D array.

20 Claims, 15 Drawing Sheets

MAGNETORESISTIVE RANDOM ACCESS MEMORY CELL AND 3D MEMORY CELL ARRAY

RELATED APPLICATIONS

The present application claims of the priority benefit of U.S. patent application Ser. No. 13/288,860 filed on Nov. 3, 2011 as Utility application, published on May 9, 2013 as US2013/0114334A1 entitled "MAGNETORESISTIVE RANDOM ACCESS MEMORY CELL WITH INDEPENDENTLY OPERATING READ AND WRITE COMPONENTS", which is incorporated herein by reference.

FIELD OF INVENTION

The invention is related to magnetoresistive random access memory cell design and how to stack multiple cells on one 2D footprint to form a 3D memory cell array to increase area density of the memory. Particularly, the so-called spin-orbit torque magnetoresistive random access memory (SOT-MRAM) cell design and 3D integration to resolve some long standing issues related to this new class of MRAM.

BACKGROUND ART

Data storage memory is one of the backbones of the modern information technology. Semiconductor memory in the form of Dynamic random-access memory (DRAM), Static random-access memory (SRAM) and flash memory has dominated the digital world for the last forty years. Comparing to DRAM based on transistor and capacitor above the gate of the transistor, SRAM using the state of a flip-flop with large form factor is more expensive to produce but generally faster and less power consumption. Nevertheless, both DRAM and SRAM are volatile memory, which means they lost the information stored once the power is removed. Flash memory on the other hand is non-volatile memory and cheap to manufacture. However, flash memory has limited endurances of writing cycle and slow write though the read is relatively faster.

MRAM is relatively a new type of memory technology. It has the speed of the SRAM, density of the DRAM and it is non-volatile as well. If it is used to replace the DRAM in computer, it will not only give "instant on" but "always-on" status for operation system, and restore the system immediately to the point when the system is power off. It could provide a single storage solution to replace separate cache (SRAM), memory (DRAM) and permanent storage (hard disk drive (HDD) or flash-based solid state drive (SSD)) on portable device at least. Considering the rapid growth of "cloud computing" technology, MRAM has a great potential and can be the key dominated technology in digital world.

MRAM stores the informative bit "1" or "0" into the two magnetic states in the so-called magnetic storage layer. The different states in the storage layer gives two distinctive voltage outputs from the whole memory cell, normally a patterned tunneling magnetoresistive (TMR) stack structure. The TMR stack structure provides a read out mechanism sharing the same well-understood physics as current magnetic reader used in conventional hard disk drive.

There are two kinds of mostly developed MRAM technologies based on the write process: one kind, which can be labeled as the conventional magnetic field switched (toggle) MRAM, uses the magnetic field induced by the current in the remote write line to change the magnetization orientation in the data stored magnetic layer from one direction (for example "1") to another direction (for example "0"). This kind of MRAM has more complicated cell structure and needs relative high write current (in the order of mA). It also has poor scalability beyond 65 nm because the write current in the write line needs to continue increase to ensure reliable switching the magnetization of the magnetic storage layer because of the fact that the smaller the physical dimension of the storage layer, the higher the magnetic coercivity it normally has for the same material. Nevertheless, the only commercially available MRAM so far is still based on this conventional writing scheme. The other class of the MRAM is called spin-transfer torque (STT) switching MRAM. It is believed that the STT-RAM has much better scalability due to its simple memory cell structure. While the data read out mechanism is still based on TMR effect, the data write is governed by physics of spin-transfer effect. Despite of intensive efforts and investment, even with the early demonstrated by Sony in late 2005, no commercial products are available on the market so far. One of the biggest challenges of STT-RAM is its reliability, which depends largely on the value and statistical distribution of the critical current density needed to flip the magnetic storage layers within every patterned TMR stack used in the MRAM memory structures. Currently, the value of the critical current density is still in the range of $10^6$ $A/cm^2$. To allow such large current density through the dielectric barrier layer such as AlOx and MgO in the TMR stack, the thickness of the barrier has to be relatively thin, which not only limits the magnetoresist (MR) ratio value but also causes potential risk of the barrier breakdown. As such, a large portion of efforts in developing the STT-RAM is focused on lower the critical current density while still maintaining the thermal stability of the magnetic data storage layer.

More recently, a new class of MRAM cell design has been proposed using so-called spin-orbit torque interaction to flip the storage layer within a TMR stack (G. Yi et. al. US2013/0114334A1). The new class of MRAM cell is a three terminator device with separated write and read paths. The storage layer of the memory cell is sandwiched between a heavy metal layer and dielectric layer to facilitate spin-orbit torque.

The spin-orbit torque effects is capable of flipping magnetic layers with either perpendicular anisotropy or in-plane anisotropy film, which has been demonstrated in the literature (I. M. Miron et. al., Nature, vol. 476, 189, (2011). "perpendicular switching of a single ferromagnetic layer induced by in-plane current injection"; L. Liu et. al., Science vol. 336, 555, (2012), "Spin-torque switching with the giant spin Hall effect of Tantalum".). However, when SOT effects are used to design magnetic memory cell, things are much more complicated than straight forward thinking.

First of all, the spin-orbit torque is an interfacial effect. Therefore, the thicker the storage layer, the higher the critical current density needed to flip the storage layer. As such, a thinner storage layer is much more desired from switching current density reduction point of view. Very unfortunately, as the size of the memory cell (i.e. the footprint of the storage layer: S) is reduced, with a thin storage layer (with thickness of t), the thermal stability of the storage layer is in serious doubt because of the thermal stability factor $KV/k_BT$ being proportion to the total magnetic volume of storage layer (K is magnetic anisotropy of storage layer, $V=S*t$ is the volume of storage layer, $k_B$ is the Boltzmann, T is the temperature in absolute temperature unit).

For memory cell design based on perpendicular storage layer (or perpendicular TMR stack), even without considering the magnitude of current density for the SOT effect, the practical challenge is that, for available $CoFe_xB_{20}/MgO/CoFe_xB_{20}$ TMR stack showing high TMR ratio, once the thickness of the storage layer $CoFe_xB_{20}$ is larger than ~1.5 nm or slightly more, the orientation of its magnetization stays in-plane of film growth plane rather than much needed perpendicular pointing. In fact, from the literature, it is believed that the perpendicular magnetization of $CoFe_xB_{20}$ layer is more repeatable when its thickness is around one nanometer.

The memory cell design based on an in-plane storage layer (or in-plane TMR stack) can have a thicker $CoFe_xB_{20}$ storage layer for available $CoFe_xB_{20}/MgO/CoFe_xB_{20}$ TMR stack showing high TMR ratio. However, the in-plane TMR stack based MRAM cell design, in general, has its own unresolved issue, i.e., the magnetic interaction between the adjacent cells due to fringe magnetic field from the storage layers causing instability and wide spread of the switching current density variation. Moreover, the thicker the storage layer, the worse the magnetic interaction as well as the larger the critical current density needed for SOT to flip the storage layer.

It is well known that one of the biggest advantages of having a perpendicular TMR stack as a MRAM cell is to increase its magnetic stability by minimizing the magnetic interaction between the adjacent cells. This is very much similar to the advantages achieved when magnetic recording medium converted from the longitudinal magnetic medium to current perpendicular magnetic medium by eliminating the magnetic interacting between the adjacent bits. In other words, a perpendicular-TMR-stack based memory cell is preferred compared with in-plane-TMR-stack based design unless the magnetic interaction between the fringe field emitted from the storage layer of the in-plane-TMR-stack based memory cell can be mitigated.

In this disclosure, we provide novel SOT-MRAM cell designs to resolve the above mentioned issues of both perpendicular-TMR based cell and in-plane TMR based cell design for SOT-MRAM.

SUMMARY OF THE INVENTION

In this invention, a novel design for SOT-MRAM is proposed. The core structure of such a design is to have an extra complementary hard magnetic layer placed very close to the magnetic storage layer, which is both electrically and magnetically isolated from the magnetic storage layer. However, the complementary hard magnetic layer and its distance from the storage layer is engineered in such a way that the magnetic field emitting from the storage layer is capable of leaving a matched magnetic footprint within the hard magnetic layer. The interaction between the magnetic footprint to the magnetic storage layer leads a huge benefits for both perpendicular-TMR and in-plane TMR stack based MRAM cell designs.

In the case of the perpendicular-TMR based SOT-MRAM cell, the above mentioned footprint within the complementary hard magnetic layer, which has perpendicular magnetic easy axis, has the same magnetic orientation as the storage layer. The complementary hard magnetic layer can thermal-stably maintain the magnetic footprint of the data storage layer when the storage layer is set at one direction. It is easy to understand by assuming the complementary hard magnetic layer adjacent to the storage layer is a perpendicular magnetic recording medium locating close to the storage layer, which acts as a perpendicular magnetic writer. The flipping of the storage layer by the SOT effects leads to the change of footprint (or recorded magnetic pattern change). As such, it is easy to know that the knowledge obtained during the development of perpendicular magnetic medium, can be easily implemented here for material design of the complementary hard magnetic layer such as engineering its coercivity and its magnetocrystalline anisotropy. Since the magnetic orientation within the complementary hard magnetic layer has the same orientation as the magnetization of the storage layer, the demagnetization field of thin perpendicular storage layer is dramatically reduced. The magnetic coupling between the complementary hard magnetic and the thin storage layer leads to great improvement of the thermal stability, which effectively means the increase the thickness of the storage layer therefore thermal barrier KV (K is magnetic anisotropy of storage layer, V=S*t is the volume of storage layer) against thermal activation $k_BT$ ($k_B$ is the Boltzmann, T is the temperature in absolute temperature unit). By adding an optional soft magnetic layer on the other side of the complementary hard magnetic layer, the storage layer will form its own mirrored image within the soft magnetic layer (acting equivalently as so-called soft magnetic underlay in perpendicular magnetic medium). This not only helps the writing the magnetic footprint within the complementary hard magnetic layer but also stabilize the storage layer by further reduce the demagnetization field of the storage layer. As such, our design resolves the problem of inferior thermal stability associate with thin perpendicular storage layer. Since the SOT-MRAM is a three-terminator device with separate writer and read paths, increasing the thickness of the TMR barrier (i.e. MgO thickness) can drastically enhance the TMR ratio for the stack with a thin magnetic storage layer on one side of the TMR barrier. Our design gives a practical design for the perpendicular-TMR stack based SOT-MRAM cell design.

For in-plane TMR stack based SOT-MRAM cell, as mentioned previously, the biggest challenges of such a design is the magnetic interaction between the storage layers of the adjacent cells. Our design has huge benefit to form a closed magnetic flux loop within each individual cell. The magnetic foot print within complement hard magnetic layer, which has an in-plane magnetic easy axis, has its magnetization direction opposite to the magnetization orientation within the storage layer. The complementary hard magnetic layer can thermal-stably maintain the magnetic footprint of the data storage layer when the storage layer is set at one direction. It is easy to understand by assuming the complementary hard magnetic layer adjacent to the storage layer is a longitudinal magnetic recording medium locating close to the storage layer, which acts as a longitudinal magnetic writer. As such, it is easy to know that the knowledge obtained during the development of longitudinal magnetic medium, can be easily implemented here for material design of complementary hard magnetic layer such as engineering its coercivity. The flipping of the storage layer by the SOT effects leads to the footprint change (or recorded magnetic pattern change). Since the flux emitting from the storage layer and the one from its 'opposite' magnetic footprint within the complementary magnetic hard layer forms a closed magnetic flux loop. It helps to not only further stabilize the storage layer but also cancel the free flux emitted from the storage layer. By material engineering refinement, the totally flux can fully cancel each other, which leads zero total fringe magnetic field emitted out from the individual SOT-MRAM cell. Just as the perpendicular case, an optional soft magnetic layer can be placed on the other side of the complementary magnetic layer. But it is definitely is not a must as it could bring more magnetic complications.

Apart from SOT-MARM cells designs for both perpendicular and in-plane TMR stack based system, we also proposed a novel electrical connection and memory array architectural design and cell sensing scheme. Our proposal of using constant sensing voltage on read line and measuring the cell voltage on level line whiling sharing only one access transistor for all memory cells stacked on one 2D cell footprint (detailed description will be given in following sections)

facilitates much simpler 3D integration capability for our SOT-MRAM array design. The design not only can extend in 2D, but also can expand to the third dimension, which greatly enhances the area density of the SOT-MRAM design.

In summary, our designs provide full solutions for thermal stability of perpendicular-TMR stack based SOT-MRAM cell design; magnetic stability and thermal stability for in-plane-TMR stack based SOT-MRAM cell design as well as a path for area density increment through 3D memory architectural and sensing scheme engineering. Our invention provides a solution and a path to area density close to and larger than 1 Gb/in$^2$ for SOT-MRAM, which could lead revolutionary change in all memory industry as well as the fundamental architecture change for computer, electrical tablet, and automation industry.

DETAILED DESCRIPTION

The following description is provided in the context of particular designs, applications and the details, to enable any person skilled in the art to make and use the invention. However, for those skilled in the art, it is apparent that various modifications to the embodiments shown can be practiced with the generic principles defined here, and without departing the spirit and scope of this invention. Thus, the present invention is not intended to be limited to the embodiments shown, but is to be accorded the widest scope consistent with the principles, features and teachings disclosed here.

Figure 1A:
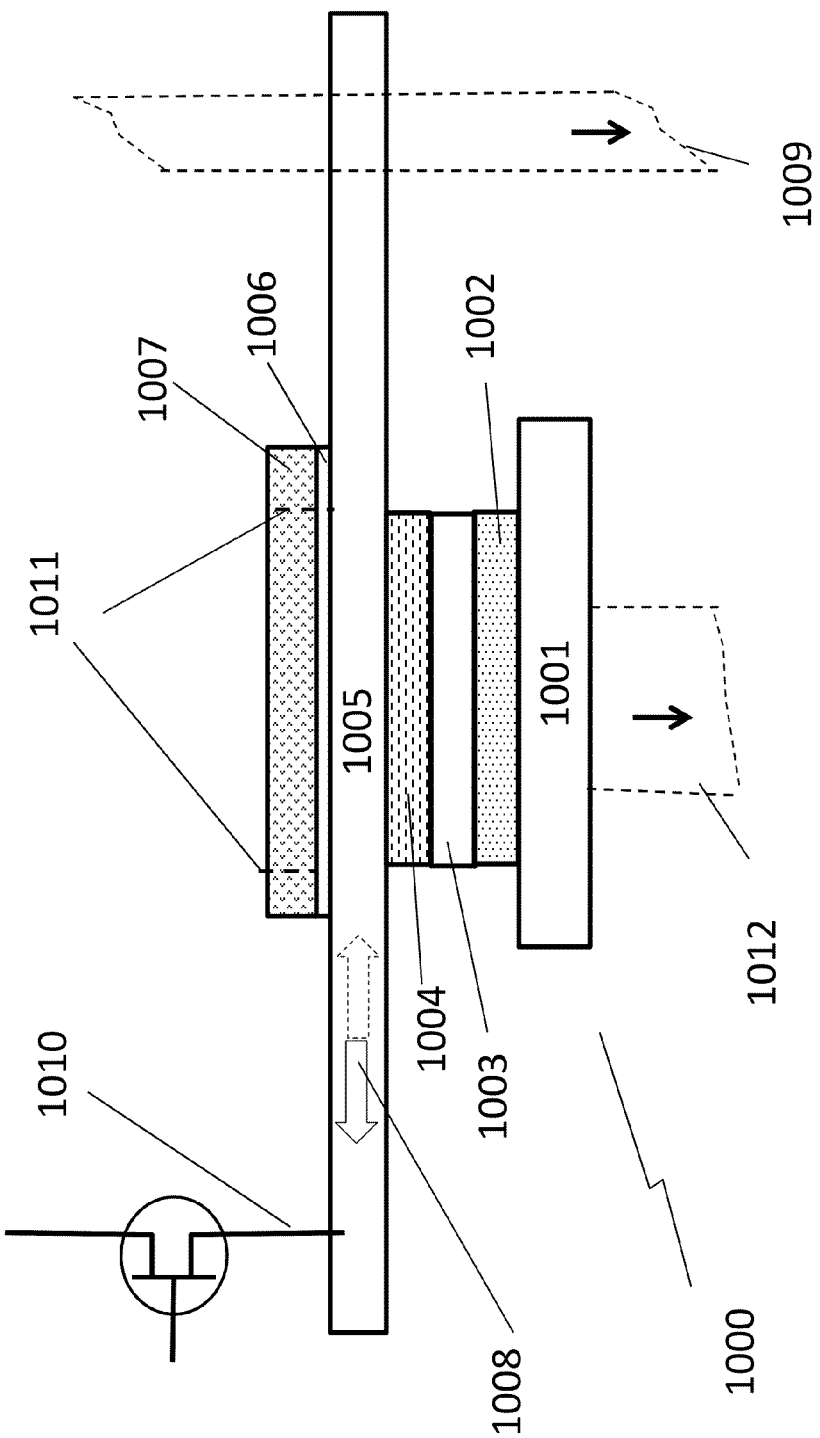
FIG. 1A illustrates one embodiment of the cross section drawings for general description of the proposed SOT-MRAM cell structure.

FIG. 1A illustrates one embodiment of the cross section drawings for general description of the proposed SOT-MRAM cell structure 1000. The purpose of FIG. 1A is to demonstrate the most important invention of the proposed SOT-MRAM cell design. In the proposed SOT-MRAM cell 1000 as shown in FIG. 1A, a TMR stack, including a reference layer 1002, a tunneling barrier 1003 (e.g. MgO), and a storage layer, is grown on top of the conducing bottom lead 1001, which also acts as a seed layer for the stack and link to 1012 for reading current/voltage supplier and reading control electronics. Adjacent to the storage layer is a writing current carrying lead 1005 made of heavy metal, such as β-Ta, β-W, Pt, Ir, Os, Re, Hf, Pd, Rh, Mo, Nb, Zr, Au, Tc, Cd, Pb, Sn or their alloys, which links on one end to 1009 leading to writing current supplier and writing control electronics. The 1005 also connects to 1010 to cell access and selection electronics such as an access transistor. Therefore, the proposed SOT-MRAM cell has three connection ends: read end (1012), write end (1009) and common end (1010). The writing current 1008 switches between two different directions (as indicated here from right to left or vice versa) can flip the magnetization direction within the data storage layer of 1004 thus change the resistance of the TMR stack. On top of the TMR stack, on the other side of 1005 is a thin electrical isolating layer 1006, over which is a magnetic stabilization layer 1007 made of hard magnetic materials similar to magnetic recording medium. The magnetic flux emitting from the magnetic storage layer 1004 can leave its magnetic footprint 1011 within 1007. The magnetic property of the 1007 is tuned in such a way that the flipping of magnetization direction of the storage layer 1004 by the switching current 1008 will lead to corresponding change of the footprint of the 1011. Similar to magnetic recording, the storage layer 1004 acts as a magnetic writer in this case and the magnetic stabilization layer similar to a magnetic recording medium. The presence of the magnetic stabilization layer 1007 help to enhance the thermal stability of the storage layer 1004 as well as the magnetic stability of the cell, which will be explained in much more details for different TMR stack in the following context.

Figure 1B:
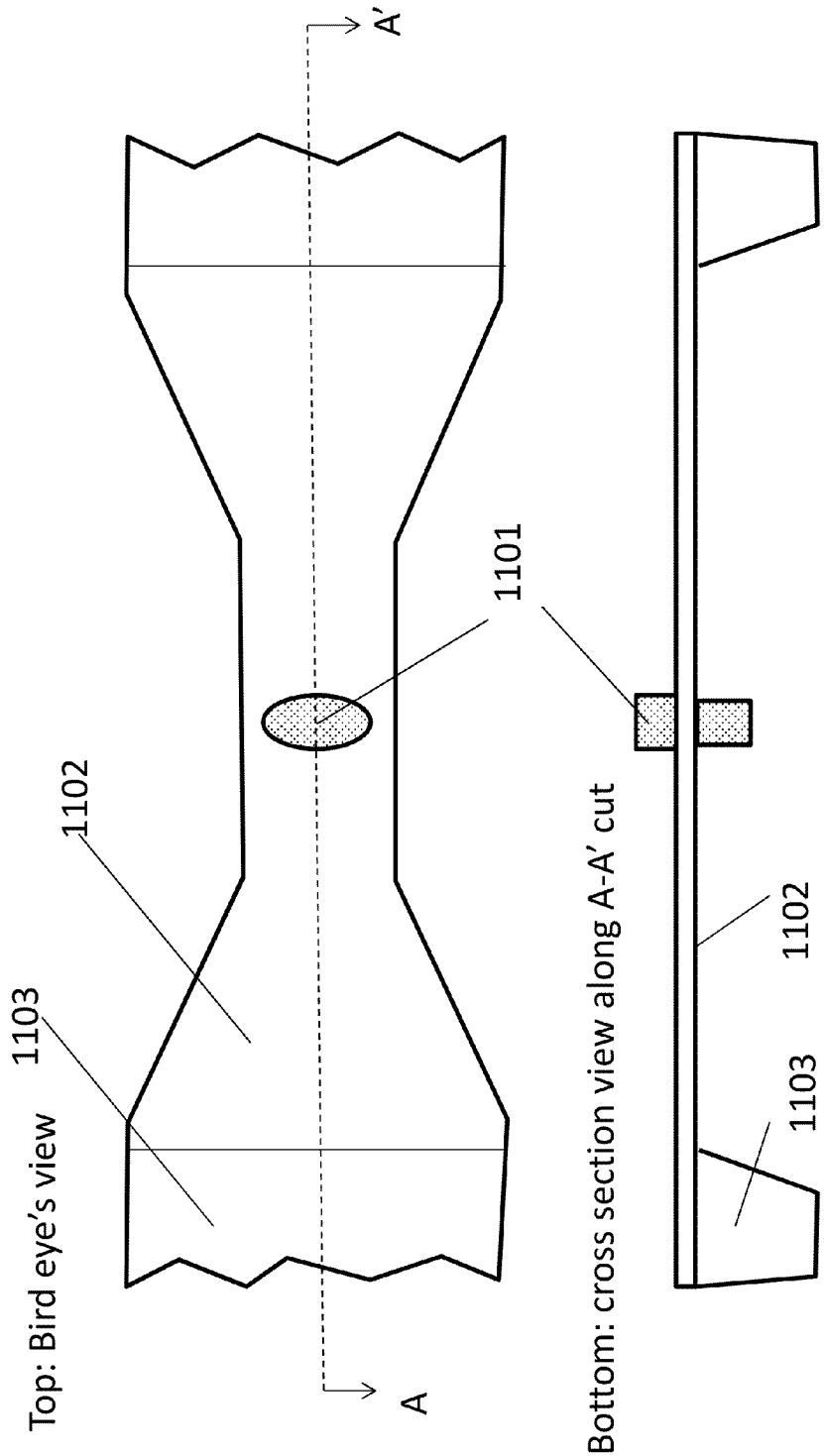
FIG. 1B shows the arrangement of the proposed SOT-MRAM cell and its switching current lead: top one is the bird eye's view; bottom one is the cross section view along the A-A' cut of the top figure.

FIG. 1B shows the arrangement of the proposed SOT-MRAM cell and its switching current lead: top one is the bird eye's view; bottom one is the cross section view along the A-A' cut of the top figure. In the figure, the SOT-MRAM cell 1101 represents what are shown as 1000 in FIG. 1A, while the switching current carrying heavy metal 1102 is similar to what is shown as 1005 in FIG. 1A. The assistant switching current carrying lead 1103 placed slightly away from the 1101 is used to reduce the resistance of the lead therefore less energy loss due to Joule heating of switching current carrying lead without affecting the SOT effect. It also shows clearly the width of the 1002 is getting narrower as approaching to the SOT-MRAM cell 1101. Such lead design increase the switching current density at the location of SOT-MRAM cell whiling reducing the overall lead resistance away from cell 1101 thus increasing energy efficiency. The FIG. 1B design looks simple but actually is very important. Considering an array of SOT-MRAM cells in the real SOT-MRAM device, such design of reducing the resistance between the cells by increasing the lead's cross section from both lead thickness direction and lateral dimension greatly increases energy efficiency and reduce the current needed to achieve the critical current density needed to flip the magnetization of the storage layer.

Figure 2A:
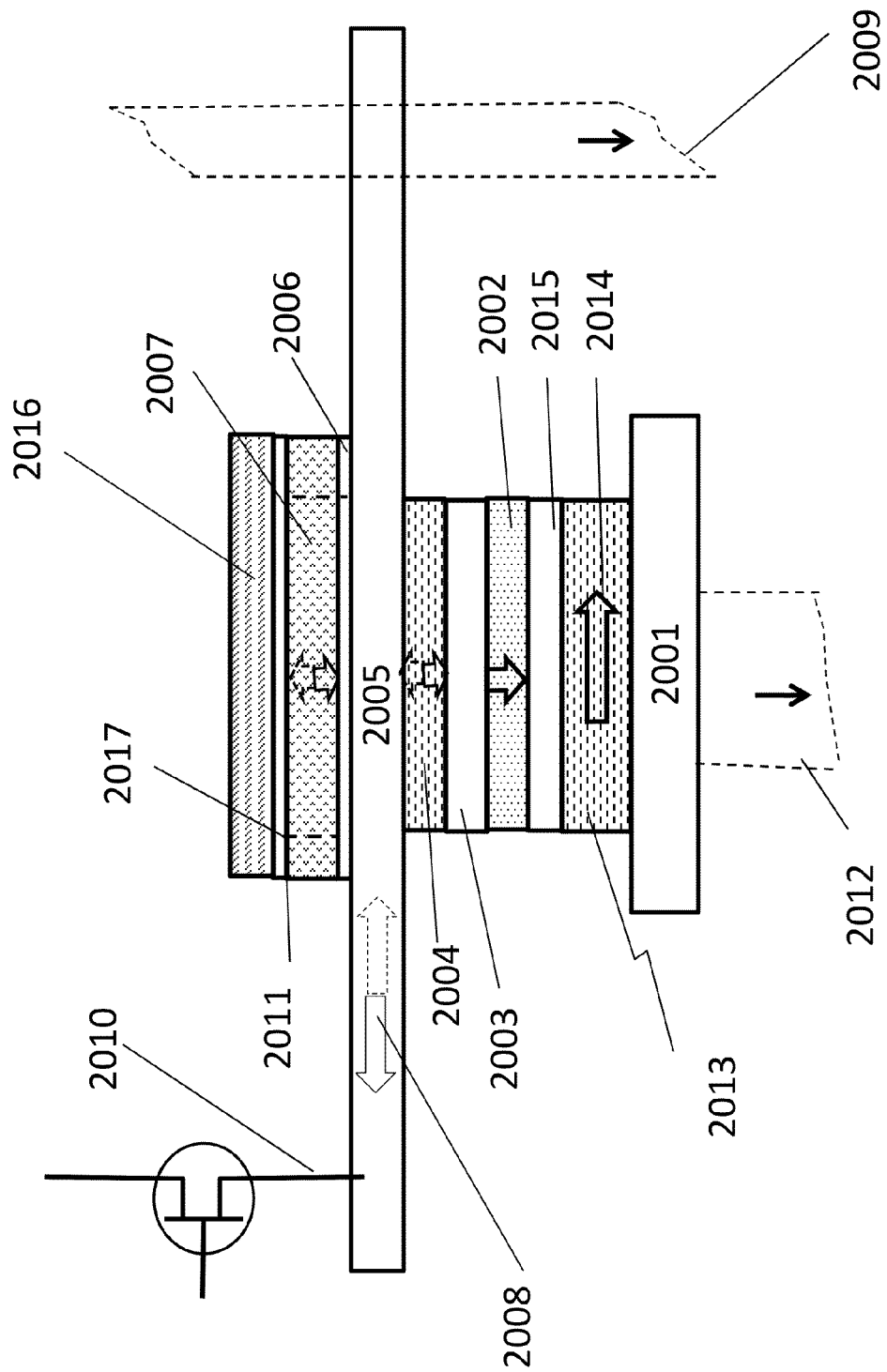
FIG. 2A illustrates one embodiment of the proposed SOT-MRAM cells based on perpendicular TMR stack locating at the bottom of the cell structure, together with an in-stack magnet providing a magnetic field bias to storage layer along the switching current direction.

FIG. 2A illustrates one embodiment of the proposed SOT-MRAM cells based on perpendicular TMR stack locating at the bottom of the cell structure, together with an in-stack magnet providing a magnetic field bias to storage layer along the switching current direction. As shown in FIG. 2A, the whole SOT-MRAM cell is built on bottom lead and seed layer 2001, which is linked to read current/voltage supplier and read control electronics 2012. An in-stack bias magnet 2013, which can be made of either a hard magnetic material, such as CoPt with corresponding seed layer or a soft-magnetic/antiferromagnetic bilayer such as CoFe/IrMn, whose magnetization is shown by arrow 2014 at the lateral direction along the direction of the switching current 2008. The end magnetic charge of the in-stack bias layer 2013 provides a magnetic field bias to the storage layer 2004 in the direction along the switching current direction. A non-magnetic metal layer, also seed layer, 2015 separates the 2014 from the rest of the cell magnetically. The reference layer (or layer structure) 2002 with fixed magnetization direction as shown by single-pointing arrow, the tunneling barrier layer 2003 and storage layer 2004, with the double-pointing arrows, forms the basic perpendicular TMR structure for the cell. Over the storage layer 2004 is the switching current lead 2005, which is made of heavy metal such as $\beta$-Ta, $\beta$-W, Pt, Ir, Os, Re, Hf, Pd, Rh, Mo, Nb, Zr, Au, Tc, Cd, Pb, Sn, or their alloys. The current lead 2005 links at one end to cell access/selection electronics 2010 and at the other end to the writing current supplier and control electronics 2009. When the switching current 2008 changes from left to right or vice versa, the magnetization of the storage layer 2004 is changed accordingly based on SOT effect. Over the 2005, separated by a thin electric isolating layer 2006 is the cell's magnetic stabilization layer 2007— one of the core inventions of this disclosure. The magnetic stabilization layer 2007 is made of perpendicular hard magnetic material(s), which is capable of creating a corresponding magnetic footprint 2017 of the storage layer 2004. In other words, for better understanding, the magnetic stabilization layer 2007 acts as a kind of perpendicular magnetic recording medium while the switchable storage layer 2004 acts as perpendicular magnetic writer. The learning from the perpendicular magnetic medium such as spring coupling perpendicular magnetic medium design can be used to design the layer 2007. An optional soft magnetic layer 2016, acting as soft under layer in perpendicular magnetic recording medium is placed on top of 2006 separate by a non-magnetic layer 2011. The magnetic foot-print of 2017 of storage layer 2004 within magnetic stabilization layer 2007 helps to stabilize the thin storage layer 2004 and increase dramatically its thermal stability by reducing the diamagnetic field of 2004 due to its ultrathin thickness. The layer 2007 can be much thicker than 2004, with bigger volume hence increasing the thermal stability against the thermal activation. This design facilitates the thinner 2004 design thus less critical current density needed for switching storage layer 2004 while maintaining needed thermal stability and magnetic stability of the storage layer 2004 hence the information stored within this kind of SOT-MRAM cell. The thinner 2004 also makes it is easier to achieve the perpendicular magnetization, especially when the CoFeB$_{20}$ layer is used as storage layer in a normal TMR stack with MgO as barrier. Moreover, the magnetostatic coupling between layer 2014 and 2016 help to neutralize the magnetic flux emitting out of the SOT-MRAM cell and reduces its impacts on the adjacent memory cells.

Figure 2B:
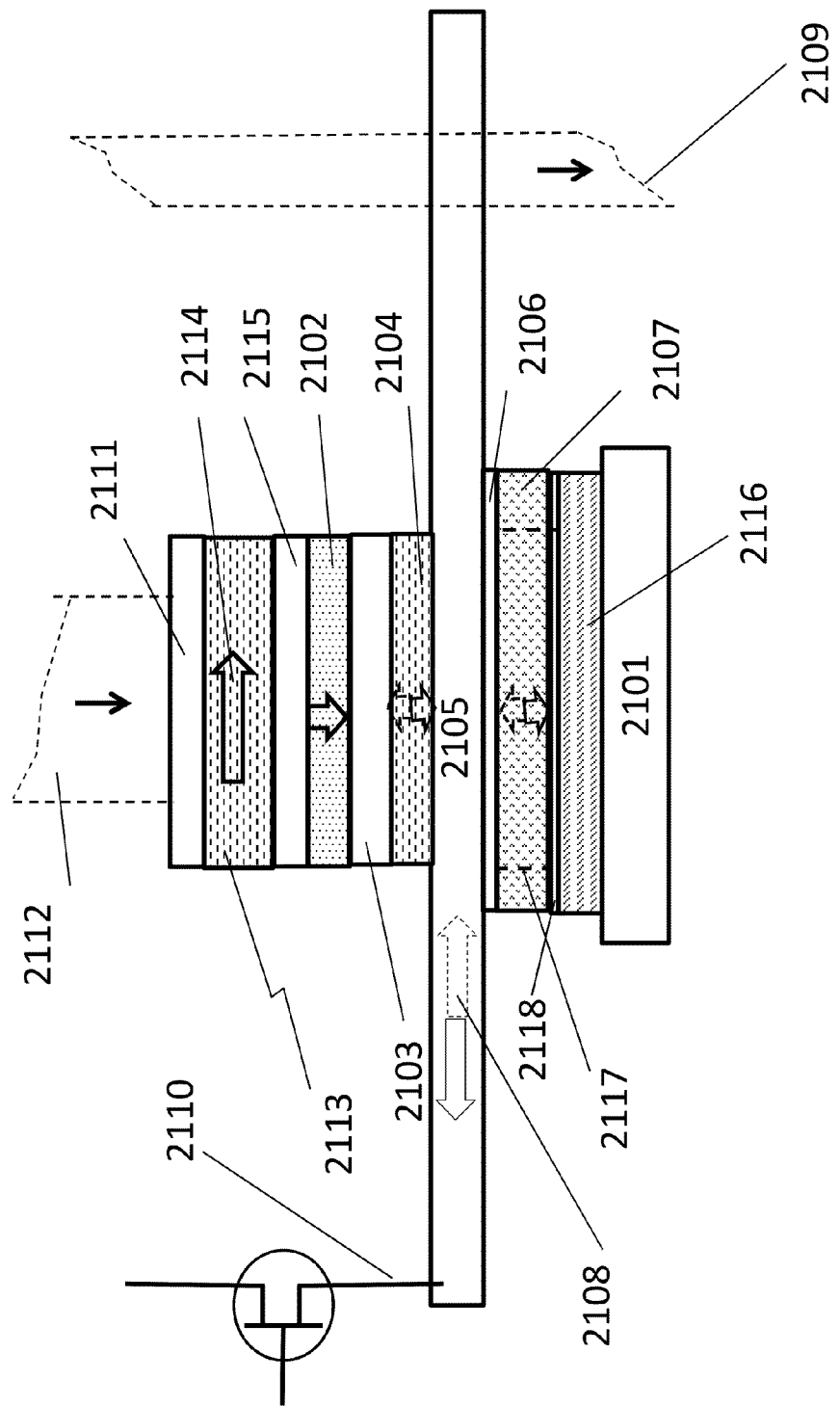
FIG. 2B illustrates one embodiment of the proposed SOT-MRAM cells based on perpendicular TMR stack locating on the top of the cell structure, together with an in-stack magnet providing a magnetic field bias to storage layer along the switching current direction.

FIG. 2B illustrates one embodiment of the proposed SOT-MRAM cells based on perpendicular TMR stack locating on the top of the cell structure, together with an in-stack magnet providing a magnetic field bias to storage layer along the switching current direction. As shown in FIG. 2B, the whole SOT-MRAM cell is built on bottom lead and seed layer 2101. On top of the 2101 is an optional soft magnetic layer 2116, which is separated from the cell's magnetic stabilization layer 2107 by a non-magnetic layer 2118. Over the magnetic stabilization layer 2107 is an insulating thin layer 2106. On top of 2106 is the switching current carrying lead 2105 made of heavy metal such as $\beta$-Ta, $\beta$-W, Pt, Ir, Os, Re, Hf, Pd, Rh, Mo, Nb, Zr, Au, Tc, Cd, Pb, Sn, or their alloys. The current lead 2105 links at one end to cell access/selection electronics 2110 and at the other end to the writing current supplier and control electronics 2109. Adjacent to 2105 is the data storage layer 2104, together with tunneling barrier layer 2103 (e.g. MgO) and fixed magnetic reference layer 2103, which forms the so-called top TMR stack structure. An in-stack bias layer 2113 is magnetically separated from reference layer 2102 by non-magnetic metallic layer 2115. Over layer 2113 is a non-magnetic capping layer 2111 as a protection layer during wafer processes. Layer 2111 is linked to read current/voltage supplier and read control electronics 2112. The in-stack bias magnet 2113, which can be made of either a hard magnetic material, such as CoPt with corresponding seed layer or a soft-magnetic/antiferromagnetic bilayer such as CoFe/IrMn, whose magnetization is shown by arrow 2114 at the lateral direction along the direction of the switching current 2108. The end magnetic charge of the in-stack bias layer 2113 provides a magnetic field bias to the storage layer 2104 in the direction along the switching current direction. When the switching current 2108 changes from left to right or vice versa, the magnetization of the storage layer 2104 is changed accordingly based on SOT effect. The magnetic field emitting from storage layer 2104 acting as writer field in perpendicular magnetic recording to create its own foot-print 2117 within the magnetic stabilization layer 2107, which acts here as perpendicular magnetic recording medium. The magnetic foot-print of 2117 of storage layer 2104 within magnetic stabilization layer 2107 helps to stabilize the thin storage layer 2104 and increase dramatically its thermal stability by reducing the diamagnetic field of 2104 due to its ultrathin thickness. The layer 2107 can be much thicker than 2104, with bigger volume hence increasing the thermal stability against the thermal activation. This design facilitates the thinner 2104 design thus less critical current density is needed for switching storage layer 2104 while maintaining needed thermal stability and magnetic stability of the storage layer 2104 hence the information stored within this kind of SOT-MRAM cell. The thinner 2104 also makes it is easier to achieve the perpendicular magnetization, especially when the CoFeB$_{20}$ layer is used as storage layer in a normal TMR stack with MgO as barrier. Moreover, the magnetostatic coupling between layer 2114 and 2116 help to neutralize the magnetic flux emitting out of the SOT-MRAM cell and reduces its impacts on the adjacent memory cells.

Figure 2C:
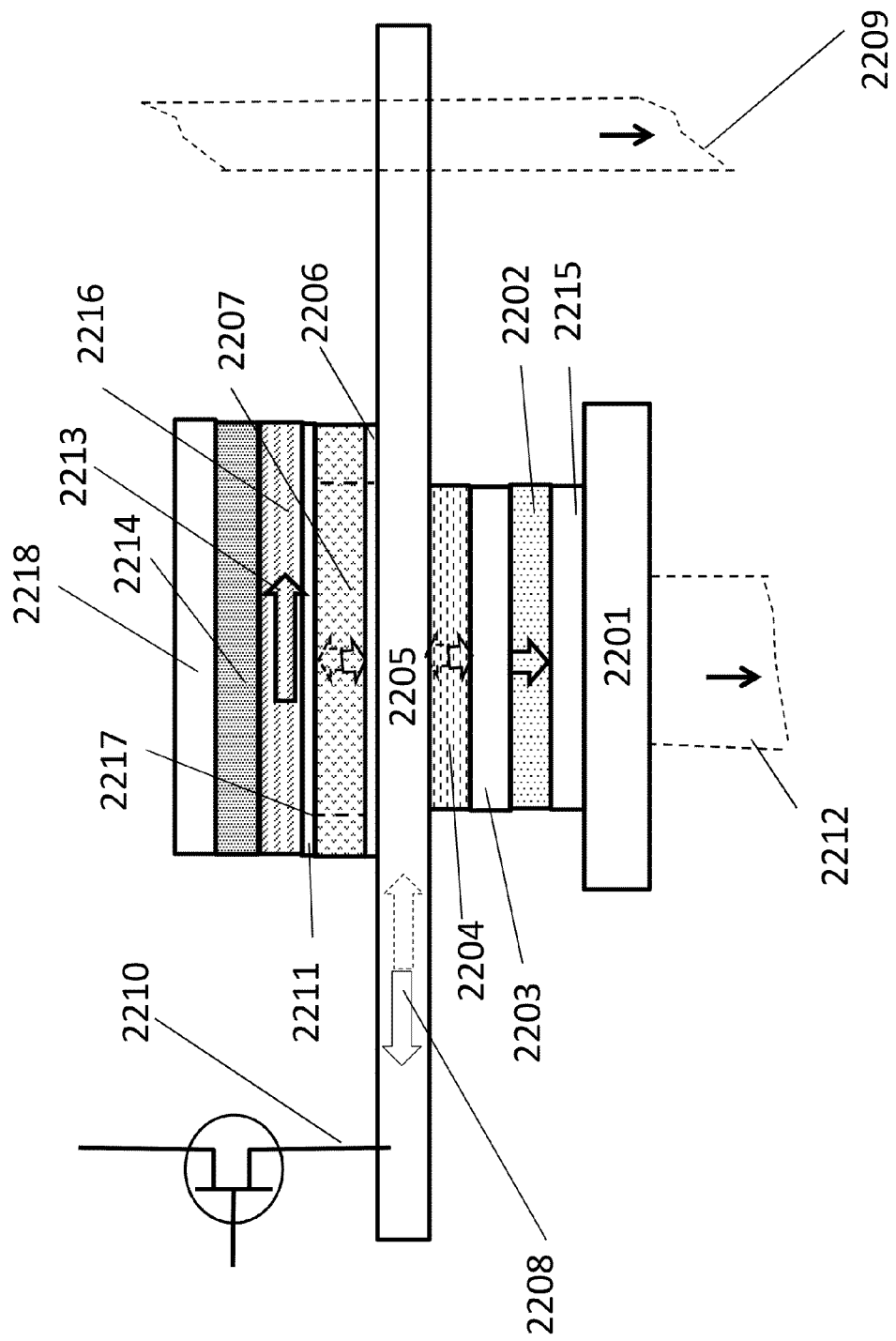
FIG. 2C illustrates one embodiment of the proposed SOT-MRAM cells based on perpendicular TMR stack locating at the bottom of the cell structure, together with an antiferromagnetic/soft magnetic bilayer, acting as soft underlayer and in-stack bias magnet along switching current direction, adjacent to magnetic stabilization layer at the top.

FIG. 2C illustrates one embodiment of the proposed SOT-MRAM cells based on perpendicular TMR stack locating at the bottom of the cell structure, together with an antiferromagnetic/soft magnetic bilayer, acting as both soft underlayer and in-stack bias magnet along switching current direction, adjacent to magnetic stabilization layer at the top. As shown in FIG. 2C, the whole SOT-MRAM cell is built on bottom lead 2201, which is linked to read current/voltage supplier and read control electronics 2212. On a metallic stack seed layer 2215, a reference layer 2202 with fixed magnetization direction as shown by single-pointing arrow, together with the tunneling barrier layer 2203 and the magnetic storage layer 2204, with the double-pointing arrows, forms the basic perpendicular TMR structure for the cell. Over the storage layer 2204 is the switching current lead 2205, which is made of heavy metal such as β-Ta, β-W, Pt, Ir, Os, Re, Hf, Pd, Rh, Mo, Nb, Zr, Au, Tc, Cd, Pb, Sn, or their alloys. The current lead 2205 links at one end to cell access/selection electronics 2210 and at the other end to the writing current supplier and control electronics 2209. When the switching current 2208 changes from left to right or vice versa, the magnetization of the storage layer 2004 is changed accordingly based on SOT effect. Over the 2205, separated by a thin electric isolating layer 2206 is the cell's magnetic stabilization layer 2207—one of the core inventions of this disclosure. The magnetic stabilization layer 2207 is made of perpendicular hard magnetic material(s), which is capable of creating a corresponding magnetic footprint 2217 of the storage layer 2204. In other words, for better understanding, the magnetic stabilization layer 2207 acts as a kind of perpendicular magnetic recording medium while the switchable storage layer 2204 acts as perpendicular magnetic writer. The learning from the perpendicular magnetic medium such as spring coupling perpendicular magnetic medium design can be used to design the layer 2207. An soft magnetic layer 2216, acting as soft under layer in perpendicular magnetic recording medium, is placed on top of 2206 separate by a non-magnetic layer 2011. Over the soft magnetic layer 2216, there is an antiferromagnetic layer 2214 such as IrMn, which sets the magnetization 2213 of the soft magnetic layer 2216 in the direction parallel to the switching current direction 2208. Over layer 2214 is a non-magnetic capping layer 2218 protecting the stack during wafer process. The end magnetic charge of the layer 2216 provides a magnetic field bias to the storage layer 2204 in the direction along the switching current 2208. The magnetic foot-print of 2217 of storage layer 2204 within magnetic stabilization layer 2207 helps to stabilize the thin storage layer 2204 and increase dramatically its thermal stability by reducing the diamagnetic field of 2204 due to its ultrathin thickness. The layer 2207 can be much thicker than 2204, with bigger volume hence increasing the thermal stability against the thermal activation. This design facilitates the thinner 2204 thus less critical current density needed for switching storage layer 2204 while maintaining needed thermal stability and magnetic stability of the storage layer 2204 hence the information stored within this kind of SOT-MRAM cell. The thinner 2204 also makes it is easier to achieve the perpendicular magnetization, especially when the CoFeB$_{20}$ layer is used as storage layer in a normal TMR stack with MgO as barrier.

Figure 2D:
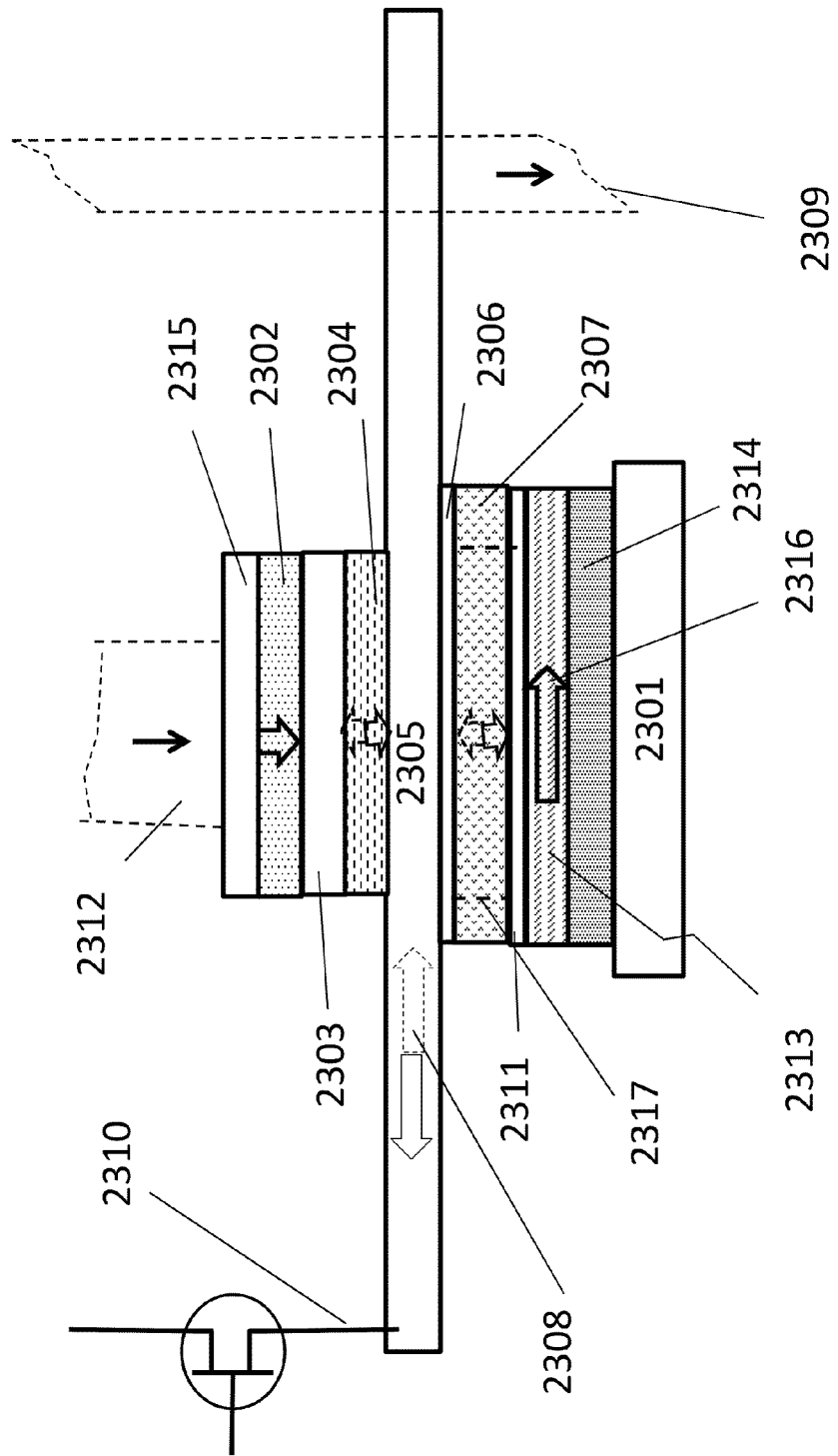
FIG. 2D illustrates one embodiment of the proposed SOT-MRAM cells based on perpendicular TMR stack locating on the top of the cell structure, together with an antiferromagnetic/soft magnetic bilayer, acting as soft underlayer and in-stack bias magnet along switching current direction, adjacent to magnetic stabilization layer at the bottom.

FIG. 2D illustrates one embodiment of the proposed SOT-MRAM cells based on perpendicular TMR stack locating on the top of the cell structure, together with an antiferromagnetic/soft magnetic bilayer, acting as soft underlayer and in-stack bias magnet along switching current direction, adjacent to magnetic stabilization layer at the bottom. As shown in FIG. 2D, the whole SOT-MRAM cell is built on bottom lead and seed layer 2301. On top of the 2301 is antiferromagnetic layer 2314, over which is a soft magnetic layer 2313, whose magnetization 2316 is set by the antiferromagnetic layer 2314 in the direction along the switching write current direction 2308. The soft magnetic layer 2313 is separated by a non-magnetic metallic layer 2311 from the magnetic stabilization layer 2307. Over the magnetic stabilization layer 2307 is an insulating thin layer 2306. On top of 2306 is the switching current carrying lead 2305 made of heavy metal such as β-Ta, β-W, Pt, Ir, Os, Re, Hf, Pd, Rh, Mo, Nb, Zr, Au, Tc, Cd, Pb, Sn, or their alloys. The current lead 2305 links at one end to cell access/selection electronics 2310 and at the other end to the writing current supplier and control electronics 2309. Adjacent to 2305 is the data storage layer 2304, together with tunneling barrier layer 2303 (e.g. MgO) and fixed magnetic reference layer 2303, which forms the so-called top TMR stack structure. Over layer 2302 is a non-magnetic capping layer 2315 as a protection layer during wafer processes. Layer 2315 is linked to read current/voltage supplier and read control electronics 2312. The end magnetic charge of the soft magnetic layer 2313 provides a magnetic field bias to the storage layer 2304 in the direction along the switching current direction. When the switching current 2308 changes from left to right or vice versa, the magnetization of the storage layer 2304 is changed accordingly based on SOT effect. The magnetic field emitting from storage layer 2304 acting as writer field in perpendicular magnetic recording to create its own foot-print 2317 within the magnetic stabilization layer 2307, which acts here as perpendicular magnetic recording medium. The magnetic foot-print of 2317 of storage layer 2304 within magnetic stabilization layer 2307 helps to stabilize the thin storage layer 2304 and increase dramatically its thermal stability by reducing the diamagnetic field of 2304 due to its ultrathin thickness. The layer 2307 can be much thicker than 2304, with bigger volume hence increasing the thermal stability against the thermal activation. This design facilitates the thinner data storage 2304 thus less critical current density is needed for switching storage layer 2304 while maintaining needed thermal stability and magnetic stability of the storage layer 2304 hence the information stored within this kind of SOT-MRAM cell. The thinner 2304 also makes it is easier to achieve the perpendicular magnetization, especially when the CoFeB$_{20}$ layer is used as storage layer in a normal TMR stack with MgO as barrier.

Figure 2E:
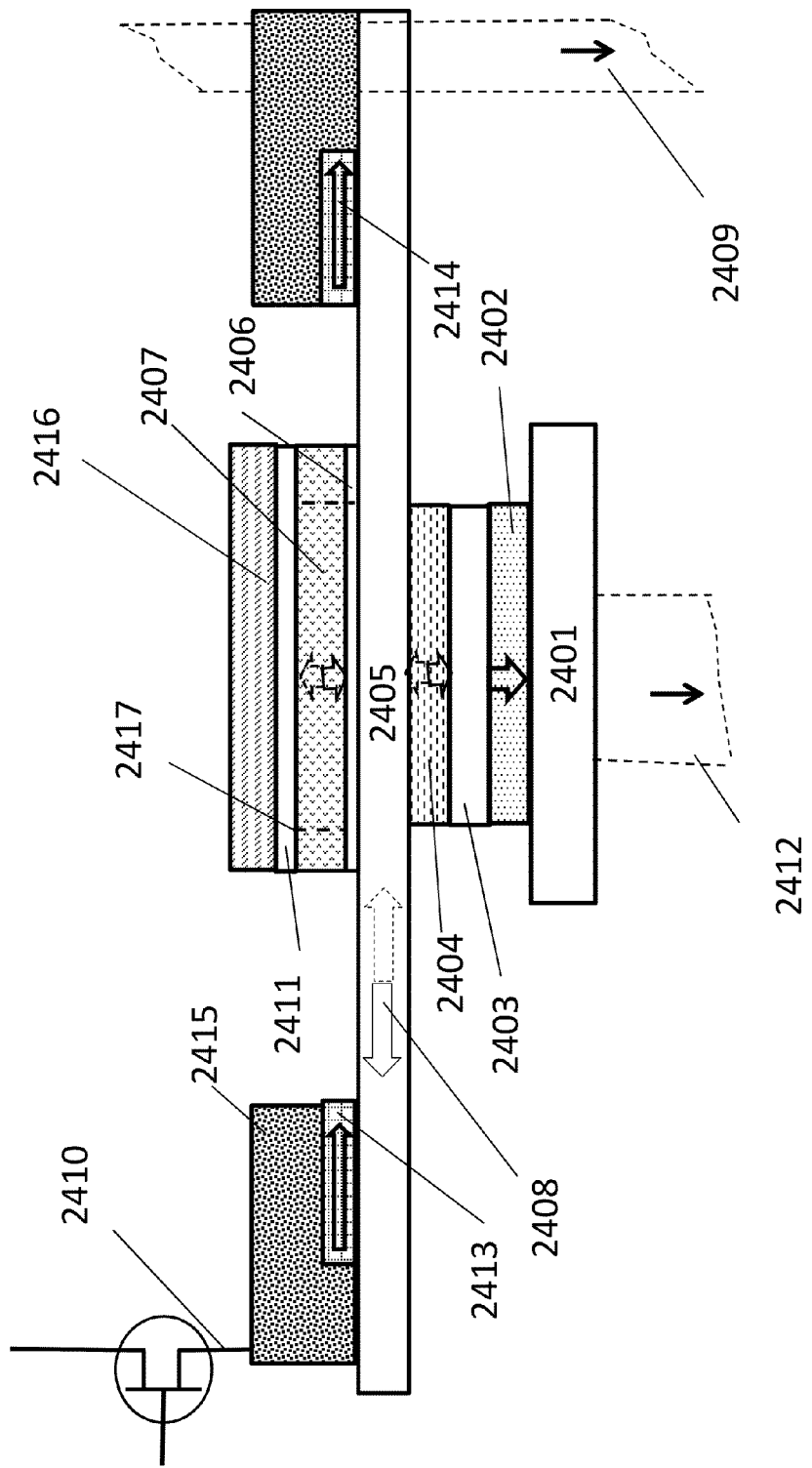
FIG. 2E illustrates one embodiment of the proposed SOT-MRAM cells based on perpendicular TMR stack locating at the bottom of the cell structure, together with side bias magnet along the leads of the cell for providing bias field and reducing the lead resistance.

FIG. 2E illustrates one embodiment of the proposed SOT-MRAM cells based on perpendicular TMR stack locating at the bottom of the cell structure, together with side bias magnet along the leads of the cell for providing bias field and reducing the lead resistance. As shown in FIG. 2E, the whole SOT-MRAM cell is built on metallic bottom lead and seed 2401, which is linked to read current/voltage supplier and read control electronics 2412. On the layer 2401, a reference layer 2402 with fixed magnetization direction as shown by single-pointing arrow, together with the tunneling barrier layer 2403 and the magnetic storage layer 2404, with the double-pointing arrows, forms the basic perpendicular TMR structure for the cell. Over the storage layer 2404 is the switching current lead 2405, which is made of heavy metal such as β-Ta, β-W, Pt, Ir, Os, Re, Hf, Pd, Rh, Mo, Nb, Zr, Au, Tc, Cd, Pb, Sn, or their alloys. The current lead 2405 links at one end to cell access/selection electronics 2410 and at the other end to the writing current supplier and control electronics 2409. Over the layer 2405, at its both sides are fixed bias magnets 2413 with its magnetization direction along switching current direction 2408 indicated by arrow 2414 and electrical conducing enhancing lead layer 2415. The relative position between 2413 and 2415 can be exchanged, either as shown here or with 2413 over 2415. The end magnetic charge of the layer 2413 provides a magnetic field bias to the storage layer 2404, as well as the optional soft magnetic layer 2416, in the direction along the switching current 2408. The fixed bias magnet 2413 can be either a hard magnet layer such as CoPt with proper seed layer or a soft magnetic/anitiferromagnetic bilayer such as CoFe/IrMn, while the magnetization of soft magnetic layer is fixed by antiferromagnetic layer. When the switching current 2408 changes from left to right or vice versa, the magnetization of the storage layer 2404 is changed accordingly based on SOT effect. Over the 2405, separated by a thin electric isolating layer 2406 is the cell's magnetic stabilization layer 2407—one of the core inventions of this disclosure. The magnetic stabilization layer 2407 is made of perpendicular hard magnetic material(s) with proper magnetic properties, which is capable of creating a corresponding magnetic footprint 2417 of the storage layer 2404 as its magnetization switched. In other words, for better understanding, the magnetic stabilization layer 2407 acts as a kind of perpendicular magnetic recording medium while the switchable storage layer 2404 acts as perpendicular magnetic writer. The learning from the perpendicular magnetic medium such as spring coupling perpendicular magnetic medium design can be used to design the layer 2407. An optional soft magnetic layer 2416, acting as soft under layer in perpendicular magnetic recording medium, is placed on top of 2406 separate by a non-magnetic layer 2411. The magnetic foot-print of 2417 of storage layer 2404 within magnetic stabilization layer 2407 helps to stabilize the thin storage layer 2404 and increase dramatically its thermal stability by reducing the diamagnetic field of 2404 due to its ultrathin thickness. The layer 2407 can be much thicker than 2404, with bigger volume hence increasing the thermal stability against the thermal activation. This design facilitates the thinner 2404 thus less critical current density needed for switching storage layer 2404 while maintaining needed thermal stability and magnetic stability of the storage layer 2404 hence the information stored within this kind of SOT-MRAM cell. The thinner 2404 also makes it is easier to achieve the perpendicular magnetization, especially when the $CoFeB_{20}$ layer is used as storage layer in a normal TMR stack with MgO as barrier.

Figure 2F:
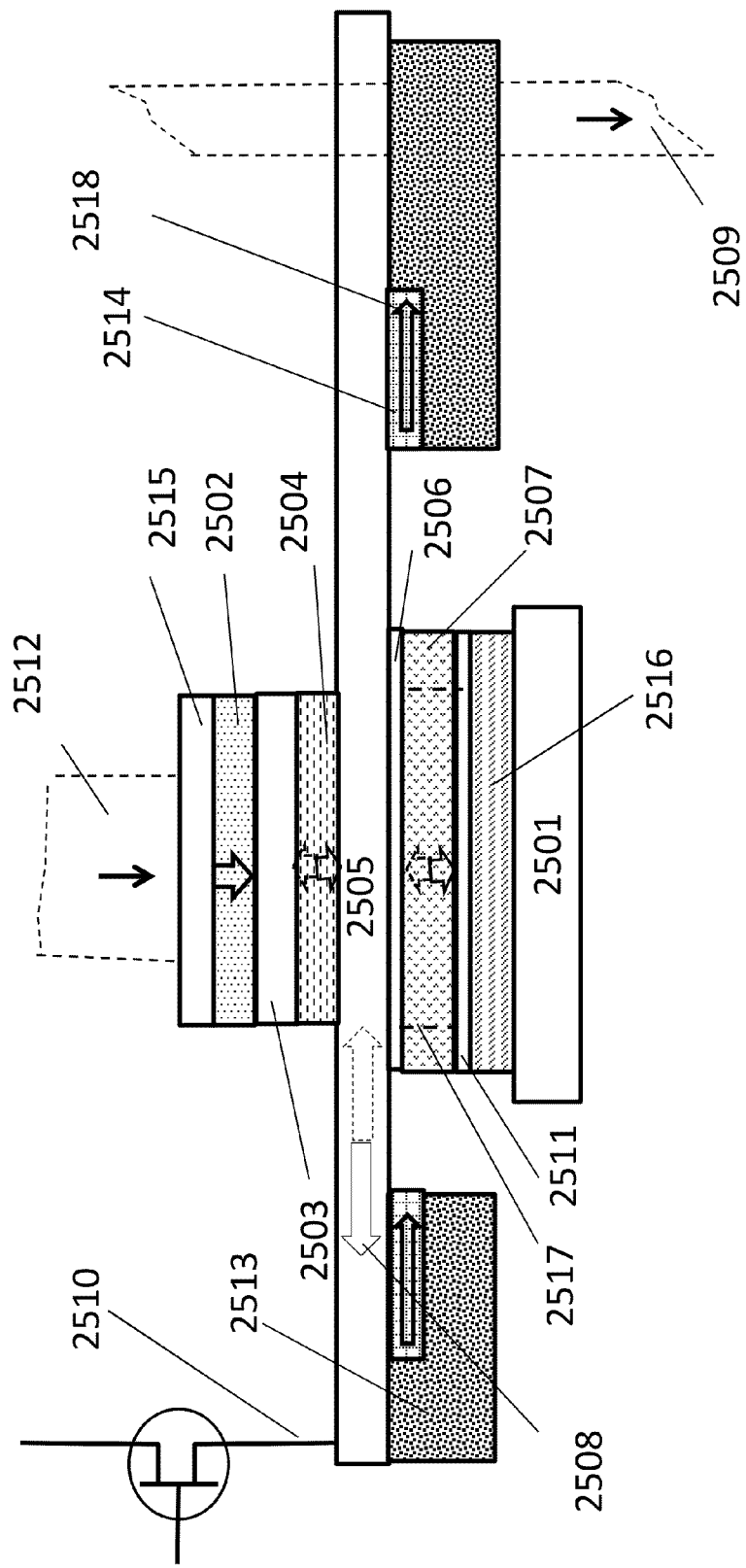
FIG. 2F illustrates one embodiment of the proposed SOT-MRAM cells based on perpendicular TMR stack locating on the top of the cell structure, together with side bias magnet along the leads (can be place either on top or at the bottom of leads) of the cell for providing bias field and reducing the lead resistance.

FIG. 2F illustrates one embodiment of the proposed SOT-MRAM cells based on perpendicular TMR stack locating on the top of the cell structure, together with side bias magnet along the leads (can be place either on top or at the bottom of leads) of the cell for providing bias field and reducing the lead resistance. As shown in FIG. 2F, the whole SOT-MRAM cell is built on bottom lead and seed layer 2501. On top of the 2501 is optional soft magnetic layer 2516. The soft magnetic layer 2516 is separated by a non-magnetic metallic layer 2511 from the magnetic stabilization layer 2507. Over the magnetic stabilization layer 2507 is an insulating non-magnetic thin layer 2506. On top of 2506 is the switching current carrying lead 2505 made of heavy metal such as β-Ta, β-W, Pt, Ir, Os, Re, Hf, Pd, Rh, Mo, Nb, Zr, Au, Tc, Cd, Pb, Sn, or their alloys. The current lead 2505 links at one end to cell access/selection electronics 2510 and at the other end to the writing current supplier and control electronics 2509. Adjacent to 2505 is the data storage layer 2504, together with tunneling barrier layer 2503 (e.g. MgO) and fixed magnetic reference layer 2503, which forms the so-called top TMR stack structure. Over layer 2502 is a non-magnetic capping layer 2515 as a protection layer during wafer processes. The layer 2515 is linked to read current/voltage supplier and read control electronics 2512. Below the layer 2505, at its both sides are fixed bias magnets 2514 with its magnetization direction along switching current direction 2508 indicated by arrow 2518 and electrical conducing enhancing lead layer 2513. The relative position between 2513 and 2514 can be exchanged, either as shown here or with 2513 over 2514. The end magnetic charge of the layer 2514 provides a magnetic field bias to the storage layer 2504, as well as the optional soft magnetic layer 2516, in the direction along the switching current 2508. The fixed bias magnet 2514 can be either a hard magnet layer such as CoPt with proper seed layer or a soft magnetic/anitiferromagnetic bilayer such as CoFe/IrMn, while the magnetization of soft magnetic layer is fixed by antiferromagnetic layer. When the switching current 2508 changes from left to right or vice versa, the magnetization of the storage layer 2504 is changed accordingly based on SOT effect. The magnetic field emitting from storage layer 2504 acting as writer field in perpendicular magnetic recording to create its own foot-print 2517 within the magnetic stabilization layer 2507, which acts here as perpendicular magnetic recording medium. The magnetic foot-print of 2517 of storage layer 2504 within magnetic stabilization layer 2507 helps to stabilize the thin storage layer 2504 and increase dramatically its thermal stability by reducing the diamagnetic field of 2504 due to its ultrathin thickness. The layer 2507 can be much thicker than 2504, with bigger volume hence increasing the thermal stability against the thermal activation. This design facilitates the thinner storage layer 2504 thus less critical current density is needed for switching storage layer 2504 while maintaining needed thermal stability and magnetic stability of the storage layer 2504 hence the information stored within this kind of SOT-MRAM cell. The thinner 2504 also makes it is easier to achieve the perpendicular magnetization, especially when the $CoFeB_{20}$ layer is used as storage layer in a normal TMR stack with MgO as barrier.

Figure 2G:
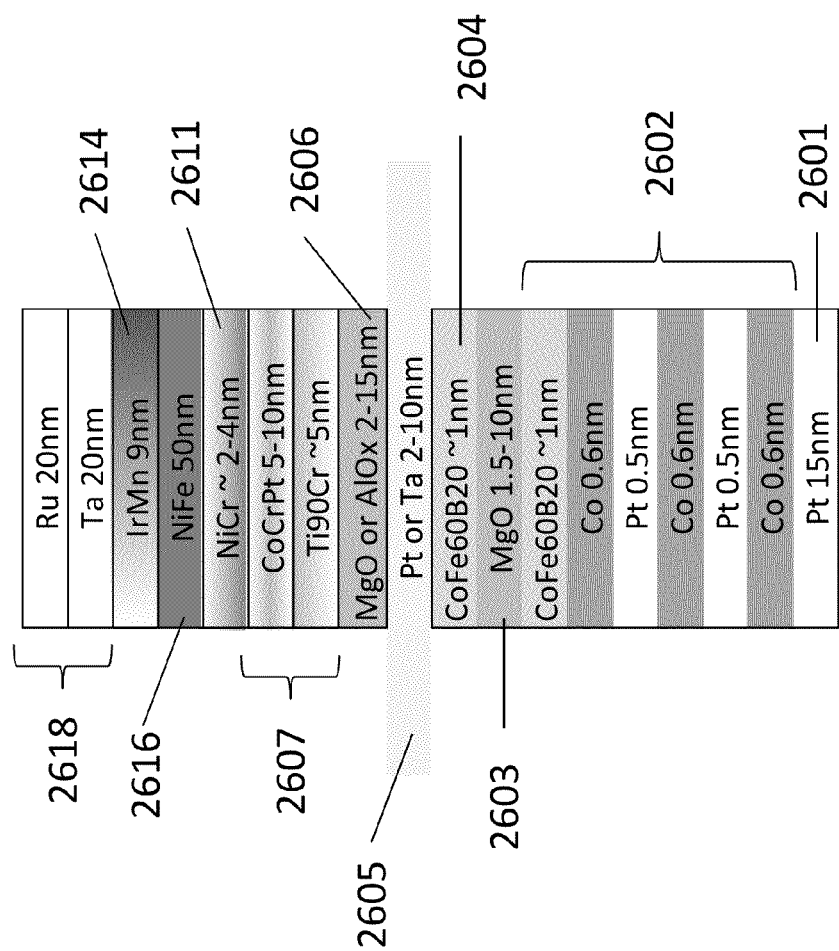
FIG. 2G shows one example of a stack for SOT-MRAM cell design shown in FIG. 2C.

FIG. 2G shows one example of a stack together with material choice for SOT-MRAM cell design shown in FIG. 2C. As shown in FIG. 2G, the Pt 15 nm acts here as 2601 seed layer and bottom lead just as 2201 in FIG. 2C. The multilayer 2602 of Co 0.6 nm/Pt 0.5 nm and $CoFe_{60}B_{20}$~1 nm with perpendicular magnetic anisotropy at the bottom side of tunneling barrier 2603 forms the bottom reference layer as 2202 of FIG. 2C. The tunneling barrier is made of MgO with thickness varying from 1.5 nm to 10 nm or even thicker depending of array and design of the whole memory array as well as target MR ratio and resistance of the stack. The reference stack's magnetic orientation can be set by external high magnetic field afterwards. The storage layer 2604 made of perpendicular ~1 nm $CoFe_{60}B_{20}$, over which there is a heavy metal switching current carrying lead 2605 (similar to 2205 of FIG. 2C) made of either Pt or β-Ta with thickness varying from 2 to 10 nm. A insulating barrier 2606 made of either MgO or AlOx (2-10 nm) separates 2605 from magnetic stabilization layer 2607 with perpendicular magnetic layer CoCrPt 5-10 nm over seed layer $Ti_{90}Cr$ ~5 nm or thinner. Over 2607, a metallic non-magnetic layer NiCr about 2-4 nm, above which there is soft magnetic layer NiFe ~50 nm. The magnetization of the NiFe is set parallel to the switching current direction by the adjacent 9 nm antiferromagnetic layer IrMn, over which a bilayer made of Ta 20 nm and Ru 20 nm acts as capping layer 2618.

Figure 2H:
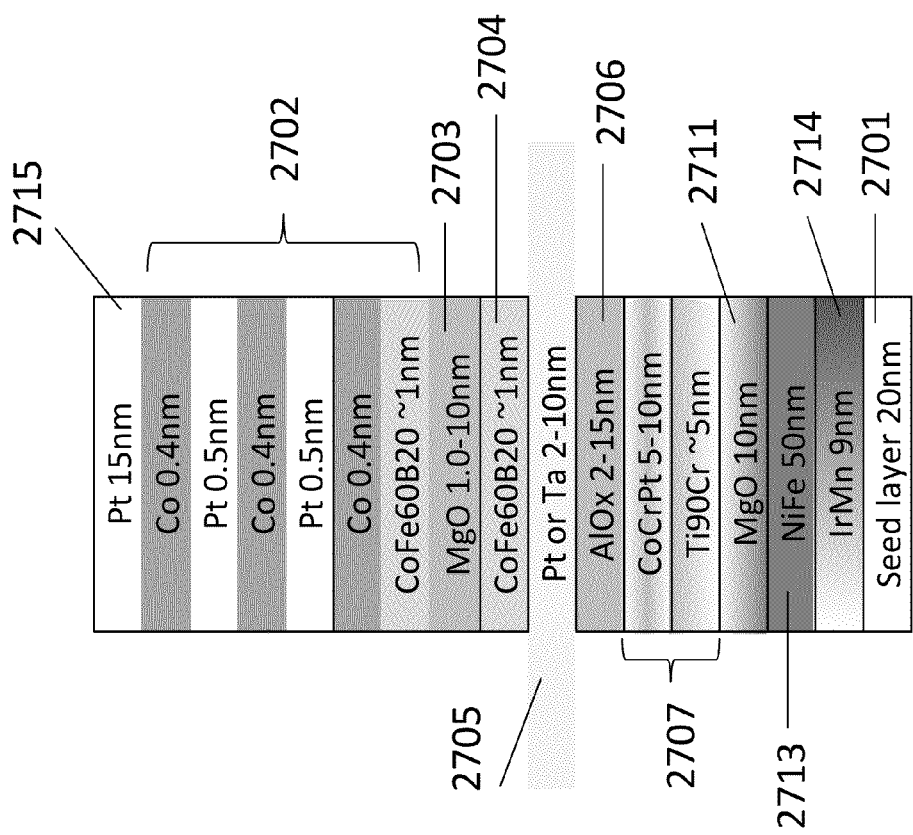
FIG. 2H shows one example of a stack for SOT-MRAM cell design shown in FIG. 2D

FIG. 2H shows one example of a stack for SOT-MRAM cell design shown in FIG. 2D. The stack starts at the bottom seed layer 20 nm, over which a 9 nm antiferromagnetic IrMn layer 2714 (similar to 2314 in FIG. 2D), which sets the magnetic direction of the soft magnetic layer 2713 made of NiFe 50 nm. An insulating layer 2711 of MgO 10 nm or more separates layer 2713 from the rest of the stack. The magnetic stabilization layer 2707 is made of its seed layer $Ti_{90}Cr$ and perpendicular hard magnetic layer CoCrPt 5-25 nm Over 2707, a thin dielectric layer made of AlOx 2-15 nm separate the switching current lead 2705 made of either Pt or β-Ta with thickness varying from 2 to 10 nm from 2707. The perpendicular storage layer 2704 is a ~1 nm $CoFe_{60}B_{20}$, over which is the tunneling barrier 2703 made of MgO varying from 1.0-15 nm or even thicker. The perpendicular magnetic reference layer 2702 made of the barrier interfacial layer $CoFe_{60}B_{20}$~1 nm and multilayer Co 0.4 nm/Pt 0.5 nm. A Pt 15 nm is used here as capping layer 2715.

Figure 3A:
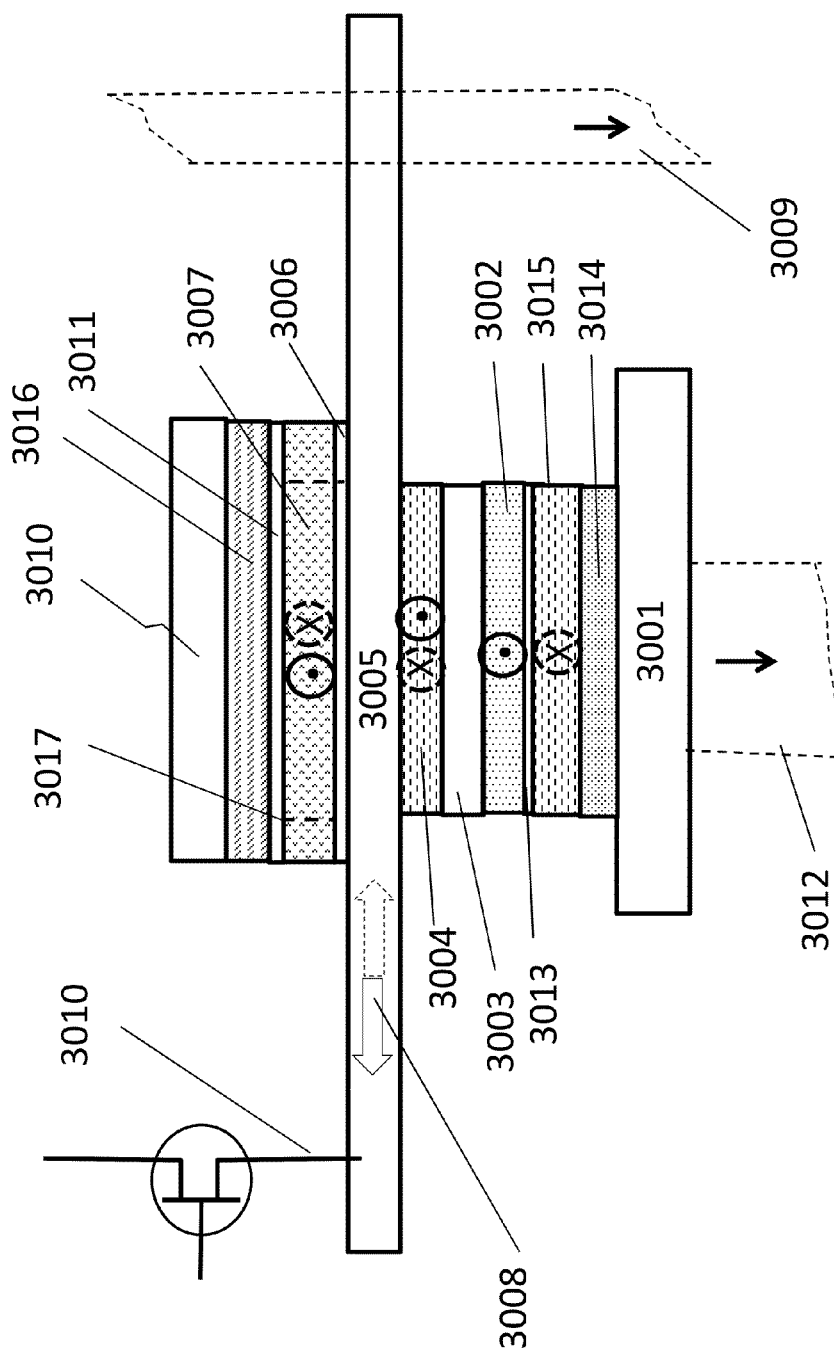
FIG. 3A illustrates one embodiment of the proposed SOT-MRAM cells based on in-plane TMR stack locating at the bottom of the cell structure, has the easy axis of all its magnetic layers in-plane and normal to the switching current direction.

FIG. 3A illustrates one embodiment of the proposed SOT-MRAM cells based on in-plane TMR stack locating at the bottom of the cell structure, has the easy axis of all its magnetic layers in-plane and normal to the switching current direction. The magnetization orientations of the magnetic layers are induced by shape anisotropy through patterning, induced anisotropy through composition of the storage layer as well as the antiferromagnetic layer's setting. This will be explained in details in the following section related to the example stack of this design. As shown in FIG. 3A, the whole SOT-MRAM cell is built on bottom lead and seed layer 3001, which is linked to read current/voltage supplier and read control electronics 3012. On the layer 3001, an antiferromagnetic layer 3014 helps to fix the magnetization of the in-plane ferromagnetic pinned layer 3015 (arrow pointing into the paper in this case), over which a thin Ru layer 3013 facilitates the antiferromagnetic RKKY coupling between the in-plane ferromagnetic reference layer 3002 (arrow pointing out of paper) and layer 3015. The whole structure including the layer 3014, 3015, 3013 and 3002 forms so-called artificial antiferromagnetic reference layer—a standard feature in an in-plane TMR stack—well-known for any skilled people in the field. On top of the layer 3002 is the tunneling barrier layer 3003, over which is the in-plane magnetic storage layer 3004, with the double-pointing arrows in-and-out of the paper. Over the storage layer 3004 is the switching current lead 3005, which is made of heavy metal such as β-Ta, β-W, Pt, Ir, Os, Re, Hf, Pd, Rh, Mo, Nb, Zr, Au, Tc, Cd, Pb, Sn, or their alloys. The current lead 3005 links at one end to cell access/selection electronics 3010 and at the other end to the writing current supplier and control electronics 3009. When the switching current 3008 changes from left to right or vice versa, the magnetization of the storage layer 3004 is changed accordingly based on SOT effect. Over the 3005, separated by a thin electric isolating layer 3006 is the cell's magnetic stabilization layer 3007—one of the core inventions of this disclosure. The magnetic stabilization layer 3007 is made of in-plane hard magnetic material(s), which is capable of creating a corresponding magnetic footprint 3017 of the storage layer 3004, which has it magnetization pointing opposite to the one of the storage layer 3004 as shown by the arrows. In other words, for better understanding, the magnetic stabilization layer 3007 acts as a kind of longitudinal magnetic recording medium while the switchable storage layer 3004 acts as longitudinal magnetic writer. The learning from the longitudinal magnetic medium such as tuning the coercivity can be used to design the layer 3007. An optional soft magnetic layer 3016, acting as soft under layer, is placed on top of 3006 separate by a non-magnetic layer 3011. Over the soft magnetic layer 3016, there is a non-magnetic capping layer 3010 protecting the stack during wafer process. With the balance design, the end magnetic charge of the footprint 3017 in the layer 3007 can cancel the end magnetic charge of the storage layer 3004 to form a closed loop for magnetic flux, which provides a further stabilization of the storage layer 3004 due to magnetostatic coupling. This design could also totally eliminate any magnetic flux leak out to the adjacent MRAM cell, therefore enable the in-plane MRAM cell design for high areal density and overall enhance the stability of the MRAM cell array. Our innovative design resolve the long standing issue associated to in-plane TMR stack used in MRAM cell, i.e. the in-plane TMR stack based MRAM cell is not suitable for high area density MRAM array because of flux leaking from one cell to adjacent cell, which impacts the magnetic stability. Our design is not only for SOT-MRAM cell design proposed here but also good as a general design solution for MRAM cell using in-plane TMR stack as a basic MRAM cell structure for eliminating its magnetic interaction between the adjacent cells due to flux leakage.

Figure 3B:
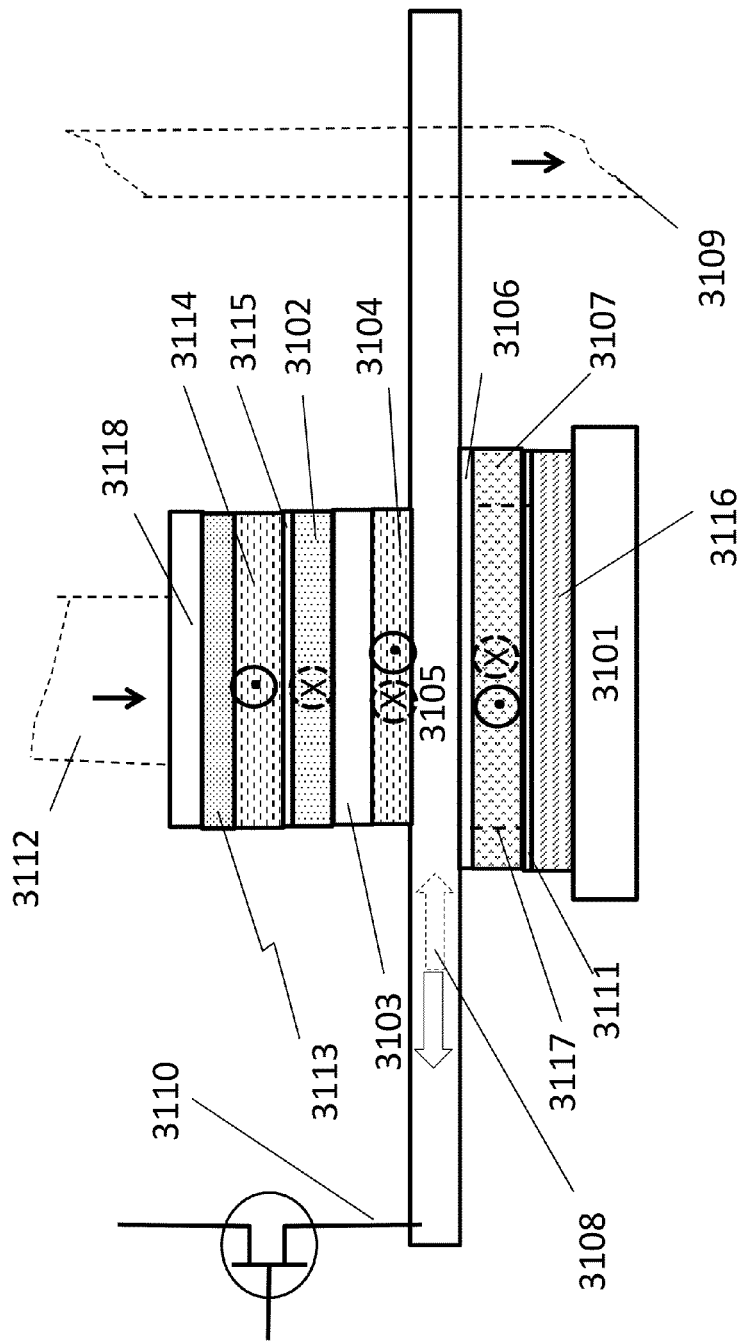
FIG. 3B illustrates one embodiment of the proposed SOT-MRAM cells based on in-plane TMR stack locating on the top of the cell structure, has the easy axis of all its magnetic layers in-plane and normal to the switching current direction.

FIG. 3B illustrates one embodiment of the proposed SOT-MRAM cells based on in-plane TMR stack locating on the top of the cell structure, has the easy axis of all its magnetic layers in-plane and normal to the switching current direction. The magnetization orientations of the magnetic layers are induced by shape anisotropy through patterning, induced anisotropy through composition of the storage layer as well as the antiferromagnetic layer's setting. As shown in FIG. 3B, the whole SOT-MRAM cell is built on bottom lead and seed layer 3101. On top of the 3101 is an optional soft magnetic layer 3116, which is separated by a non-magnetic layer 3111 from the magnetic stabilization layer 3107. Over the magnetic stabilization layer 3107 is an insulating thin layer 3106. On top of 3106 is the switching current carrying lead 3105 made of heavy metal such as β-Ta, β-W, Pt, Ir, Os, Re, Hf, Pd, Rh, Mo, Nb, Zr, Au, Tc, Cd, Pb, Sn, or their alloys. The current lead 3105 links at one end to cell access/selection electronics 3110 and at the other end to the writing current supplier and control electronics 3109. Adjacent to 3105 is the magnetization-in-plane-orientated data storage layer 3104, whose magnetization is switchable and indicated by doubly pointing arrows in-and-out of the paper), together with tunneling barrier layer 3103 (e.g. MgO) and a fixed in-plane artificial antiferromagnetic reference layer structure, including magnetic reference layer 3102, with its magnetization indicated by an arrow pointing into the paper; the thin Ru layer 3115 for inducing antiferromagnetic RKKY coupling; a pinned in-plane ferromagnetic layer 3114; and antiferromagnetic layer 3113 such as IrMn. Over layer 3113 is a non-magnetic capping layer 3118 as a protection layer during wafer processes. Layer 3118 is linked to read current/voltage supplier and read control electronics 3112. When the switching current 3108 changes from left to right or vice versa, the magnetization of the storage layer 3104 is changed accordingly based on SOT effect. The magnetic field emitting from storage layer 3104 acting as writer field in longitude magnetic recording to create its own foot-print 3117 within the magnetic stabilization layer 3107, which acts here as longitudinal magnetic recording medium. The magnetic foot-print of 3117 of storage layer 3104 within magnetic stabilization layer 3107 helps to stabilize the storage layer 3104 by forming a magnetic flux close loop, which increases its thermal stability by reducing or totally eliminate the diamagnetic field of 3104 its edge magnetic charge. Although, in the figure shown here, the lateral dimension of the 3107 is larger than the storage layer 3104, it can be a bit smaller than 3104, which will not affect the functionality of 3107 described. Similarity also holds for the all the hard magnetization stability layer described in the previous sections/context. This design could also totally eliminate any magnetic flux leak out to the adjacent MRAM cell, therefore enable the in-plane MRAM cell design for high areal density and overall enhance the stability of the MRAM cell array. Our innovative design resolves the long standing issue associated to in-plane TMR stack used in MRAM cell, i.e. the in-plane TMR stack based MRAM cell is not suitable for high area density MRAM array because of flux leaking from one cell to adjacent cell, which impacts the magnetic stability. Our design is not only for SOT-MRAM cell design proposed here but also good as a general design solution for MRAM cell using in-plane TMR stack as a basic MRAM cell structure for eliminating its magnetic interaction between the adjacent cells due to flux leakage.

Figure 3C:
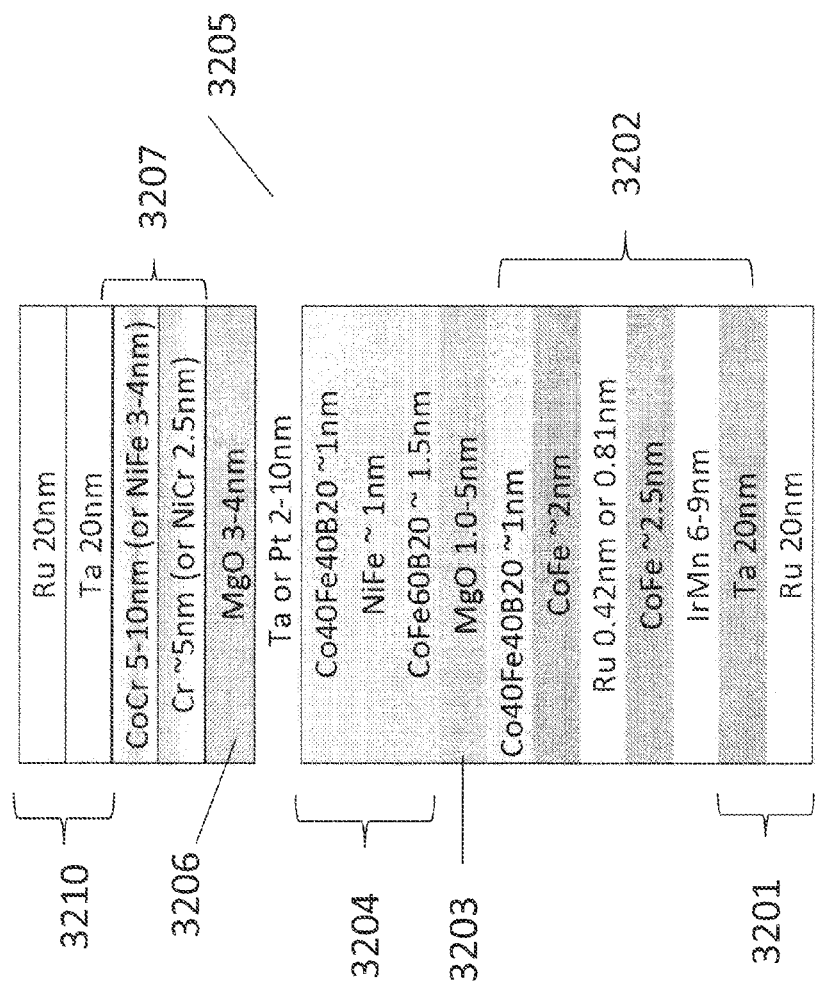
FIG. 3C shows one example of a stack for SOT-MRAM cell design shown in FIG. 3A.
Figure 4:
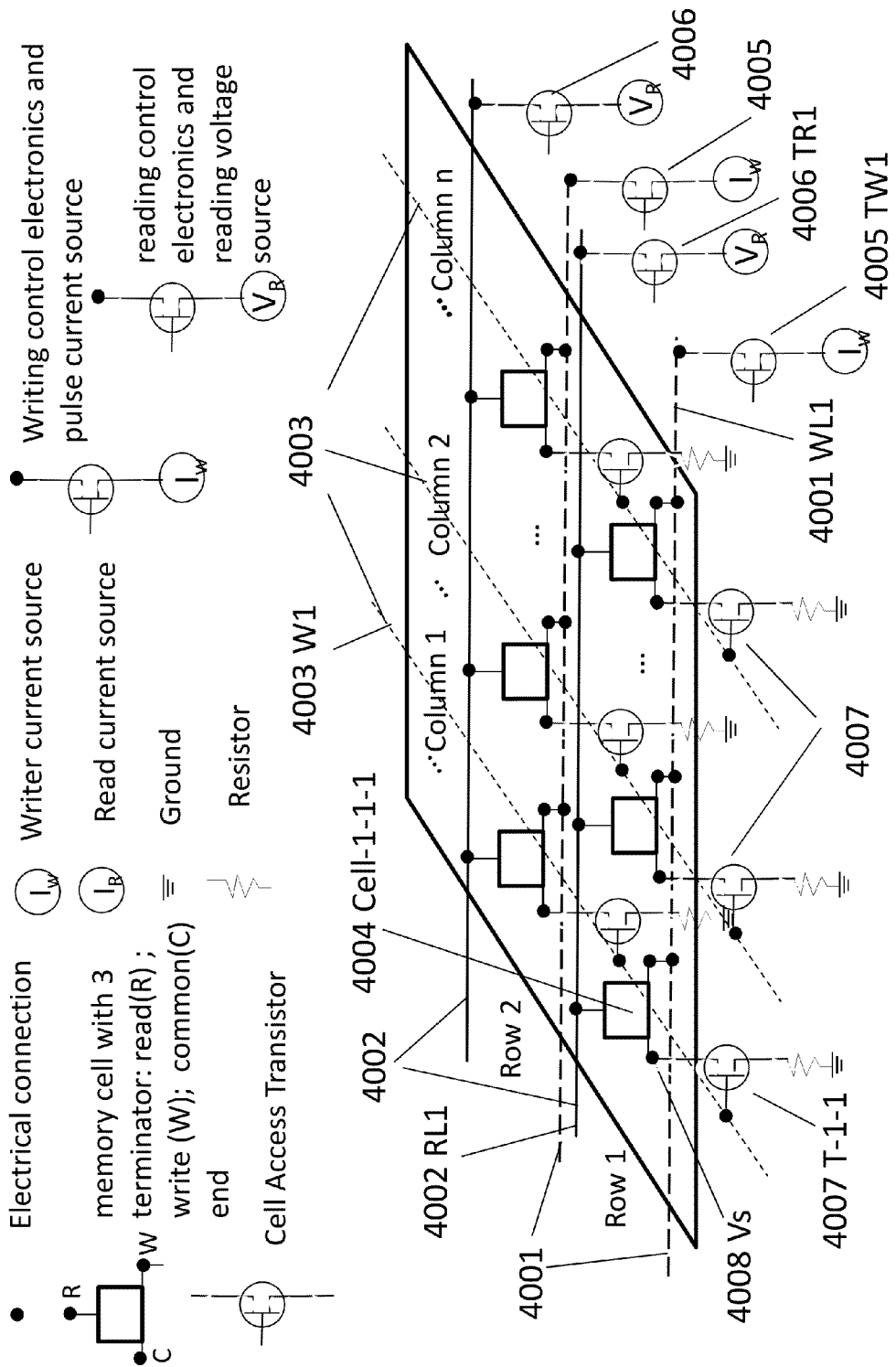
FIG. 4 illustrates the proposed electrical connection, memory array architectural design, and cell sensing scheme in a 2D cell array for general SOT-MRAM together with the notation of the drawing symbols used in this figure.

FIG. 3C shows one example of a stack for SOT-MRAM cell design shown in FIG. 3A. In FIG. 3C, the stack is built on bottom lead and seed 3201 made of Ru 20 nm/Ta 20 nm. In the real stack below Ru could have an extra adhesion layer or the seed layer. It also can be replaced by a layer of Ta 20 nm only without need of Ru layer. The IrMn 6-9 nm/CoFe 2.5 nm/Ru either 0.42 nm or 0.81 nm/CoFe 2 nm/$Co_{40}Fe_{40}B_{20}$ 1 nm to 2 nm layer structure with in-plane magnetization forms so-called artificial antiferromagnetic reference structure 3202. The tunneling barrier 3203 is MgO with thickness varying from 1 nm to 25 nm pending on the array design and electronics of the MRAM array structure. The tri-layer structure $CoFe_{60}B_{20}$~1.5 nm/NiFe 1 nm/$Co_{40}Fe_{40}B_{20}$~1 nm with the in-plane magnetization is the storage layer 3204. During the magnetic field annealing, the magnetization of the magnetic layer is set by the external magnetic field annealing through IrMn alignment for 3202 and induced magnetic anisotropy of NiFe ~1 nm for storage layer 3204. Of course, the anisotropy can be further enhanced through shape anisotropy via patterning of the MRAM cell with long axis normal to the paper plane. The switching current lead 3205 is either Pt or β-Ta with thickness between 2-10 nm, over which is the insulating layer 3206 made of MgO 3-4 nm. The magnetic stabilization layer 3207 comprises 5 nm seed layer Cr (or NiCr ~2.5 nm) and in-plane hard magnetic layer CoCr 5-15 nm (or NiFe 8 nm). The capping layer over 3207 is made of Ta 20 nm/Ru 20 nm FIG. 4 illustrates the proposed electrical connection, memory array architectural design and cell sensing scheme in a 2D cell array for general SOT-MRAM together with the notations of the drawing symbols used in this figure. In FIG. 4, although there are only six memory cells are shown, the principle and repeatability can extend in two directions, both row and column, to form a full 2D array. The horizontal dash lines 4001 are the write lines linked to writing control electronics and writing pulse current source 4005, while the horizontal solid line represents the read-line 4002 connected to reading control electronics and reading voltage/current source 4006. The individual write line 4001 of one particular row (two rows—Row 1 and Row 2—are shown here in FIG. 4) also connects to writing ends of all the MRAM cells within this row in the same plane, while the read-line 4002 of one particular row links to all the top connections (read end) of MRAM cells within the row for through-cell-stack sensing. Every MRAM cell has an access transistor 4007, whose gate is connected to word line 4003 in the same column (three columns—column 1, column 2, and column n—are shown here in FIG. 4) while the source and drain of the transistor connect to the common end of MRAM cell and through resistance to ground respectively. During operation, whenever a line is not used or activated, it maintains the same high potential compared with the reference potential of the whole memory array in an open circuit status, which means zero current flows through the line. In the following context, we will use the cell 4004 named Cell-1-1-1 (notation: cell-row number-column number-plane level number) as an example to explain how it works. Cell 4004 (cell-1-1-1) has its read-end connecting to one of read line 4002 named RL1; its write end connecting to one of the write line 4001 named WL1; its common end connects to its cell access transistor 4007 named T-1-1 at point 4008. The transistor 4007 T-1-1 through a resistor to the ground. During Cell-1-1-1's read process, all other lines are deactivated and maintain the same potential level with the reference potential of the whole MRAM array at open circuit status, except the one 4002 RL1 and 4003 W1. The 4002 RL1 is activated to a higher sensing potential by its control electronics 4006 TR1, while the word line 4003 W1 turn on the transistor. The sensing current flows from the read-end of Cell-1-1-1 through connection point 4008, through the access transistor, then a resistor to the ground. The potential level of output voltage Vs at connection 4008, either higher or lower, is used to decide whether the storage layer has the same magnetization orientation as reference layer (lower resistance state—digital "0" state) or opposite (higher resistance state—digital "1" state) respectively. During Cell-1-1-1's write process, all other lines are deactivated and maintain the same potential level with the reference potential of the whole MRAM array at open circuit status, except the one 4001 WL1 and 4003 W1. The 4001 WL1 is activated either to higher (positive potential) or lower (negative potential) write potential by its control electronics 4005 TW1, while the word line 4003 W1 turn on the transistor. The absolute writer current value above the critical current passes between the write end and common end of the memory cell to flip the magnetization of the storage layer as needed. The similar principle holds for any other cells read and write in this 2D MRAM array.

Figure 5:
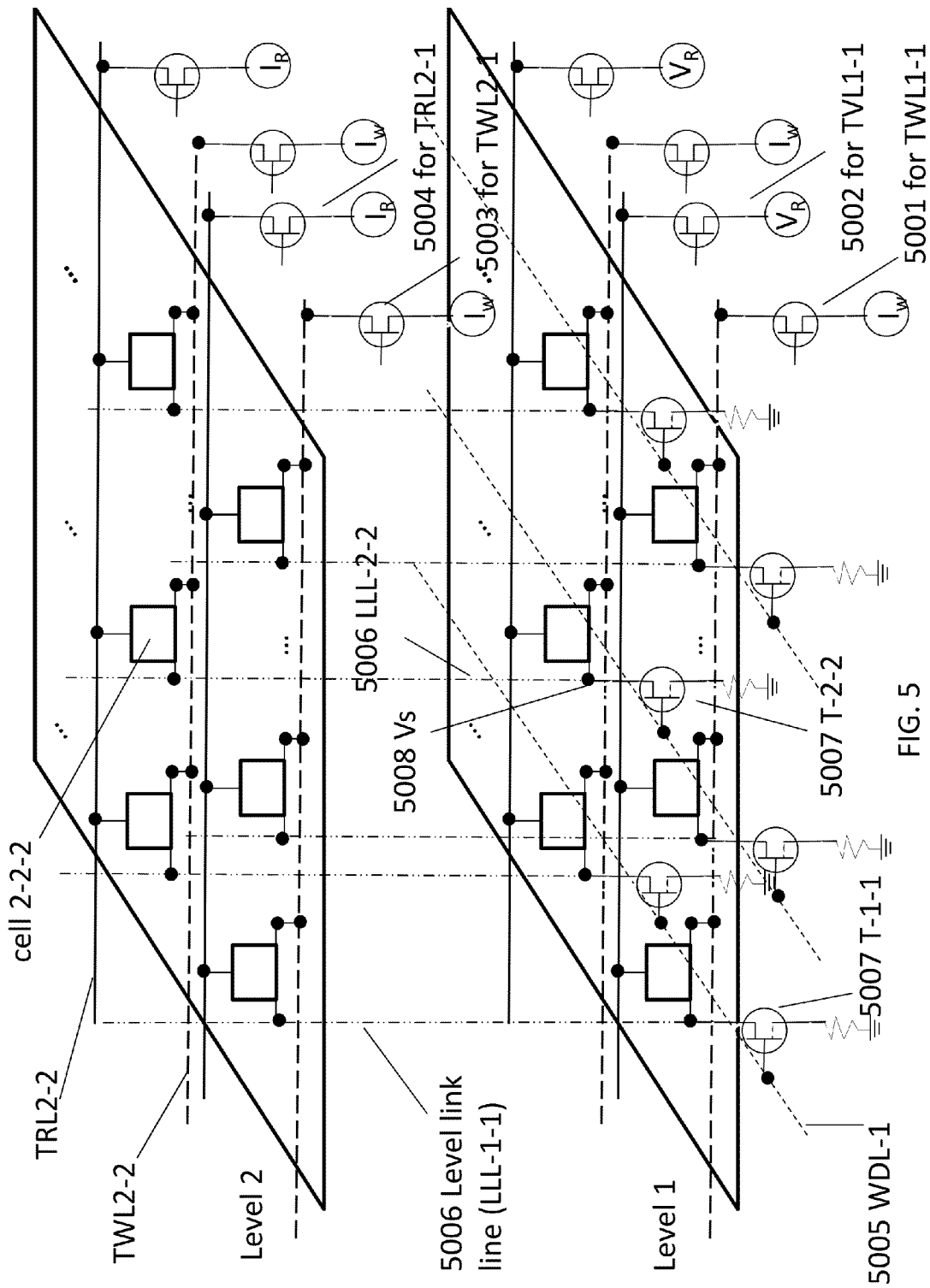
FIG. 5 illustrates the proposed electrical connection, memory array architectural design and cell sensing scheme for a 3D cell array for general SOT-MRAM.

FIG. 5 illustrates the proposed electrical connection and memory array architectural design and cell sensing scheme for a 3D cell array for general SOT-MRAM. Although two levels of the 2D arrays are shown here in FIG. 5, the level number can further increase by stacking level (n+1) over level n by following the principle described here till the resolution of electronic circuit of the memory array can handle. The level 1 is very much identical to what has been described in FIG. 4 and it is the only level has the word lines 5005. In level 1, the horizontal dash lines are the write lines linked to writing control electronics and writing pulse current source 5001, while the horizontal solid line represents the read-line connected to reading control electronics and reading voltage/current source 5002. To achieve 3D memory array, there are multiple 2D arrays similar to what is shown in level 2 here. Similar to what has been described in FIG. 4, the horizontal dash lines in level 2 are the write lines linked to writing control electronics and writing pulse current source 5003, while the horizontal solid line represents the read-line in level 2 connected to reading control electronics and reading voltage/current source 5004. In level 2, the individual write line 5003 of one particular row also connects to the in-plane writing ends of all the MRAM cells within this row, while the read-line 5004 of one particular row links to all the top read connections of MRAM cells within the row for through-cell-stack sensing. Different from the level 1, the memory cells of level 2 or all the other level do not have its own access transistor, thus no word-line in level 2 or the other level. Instead, there is level link line 5006, which links all common ends of the cell-m-n-x to cell-m-n-1 to allow one access transistor belonging to cell-m-n-1 to be shared by the cells (cell-m-n-x) above it in different levels. Similar to the case of the 2D array, during operation, whenever a line is not used or activated, it maintains the same high potential compared with the reference potential of the whole memory array in an open circuit status, which means zero current flows through the line. During write process, for a cell-m-n-x (e.g. cell-2-2-2) at level x (e.g. level 2), once its access transistor T-m-n (e.g. 5007 T-2-2) and its write-line TWLx-m (e.g. TWL2-2) is activated (similar to what described for FIG. 4), either to higher (positive potential) or lower (negative potential) write potential by its control electronics, the absolute writer current value above the critical current passes between the write end and common end of memory cell-m-n-x (e.g. cell-2-2-2) to flip the magnetization of the storage layer of the cell as needed. During read process, for a cell-m-n-x (e.g. cell-2-2-2) at level x (e.g. level 2), once its access transistor T-m-n (e.g. 5007 T-2-2) is turned on and its read-line TRLx-m (e.g. TRL2-2) is activated to a higher sensing potential by its control electronics, the sensing current flows from the read-end of Cell-m-n-x (e.g. cell-2-2-2) through connection point 5008, through access transistor T-m-n (e.g. T-2-2), then a resistor to the ground. The potential level of output voltage Vs at connection 5008 on the 5006 level link line LLL-2-2, either higher or lower, is used to decide whether the storage layer has the same magnetization orientation as reference layer (lower resistance state—digital "0" state) or opposite (higher resistance state—digital "1" state) respectively. As it is shown here, with proper architecture design, the proposed SOT-MRAM cell is capable of 3D level memory integration, which could very efficiently stack 2D arrays together to gain the area density within the same footprint of a single level 2D array.

What is claimed is:

1. A memory cell comprising:
   At least a magnetic data storage layer, sandwiched between a non-magnetic heavy metal layer and a dielectric tunneling layer, whose magnetization is switchable between two opposite orientations by an in-plane cell writing current capable of being pulsed in two different directions within the heavy metal layer;
   A magnetization-fixed reference layer or (or layer structure), located adjacent to said dielectric tunneling barrier, combines with said magnetic data storage layer and said dielectric tunneling barrier to form a tunneling magnetoresistive (TMR) stack used to sense the magnetization orientation of the data storage layer with respect to the magnetization orientation of the reference layer (or layer structure) via sensing current through the tunneling barrier;
   At least a magnetic stabilization layer, electrically isolated from said non-magnetic heavy metal layer and located on the opposite side of said magnetic data storage layer, functions to contain a complementary magnetic footprint of said magnetic data storage layer to enhance either thermal, or magnetic, or both thermal and magnetic stability of said magnetic data storage layer.

2. The memory cell of claim 1 further comprise an in-plane soft magnetic layer, close to but magnetically isolated from said magnetic stabilization layer for assisting the creation of said complementary magnetic footprint of said magnetic data storage layer.

3. The memory cell of claim 1, wherein said non-magnetic heavy metal layer is made of either Pt, or Pd, or Ir, or Au, or Re, or Rh, or β-Ta, or Os, or β-W, or Hf, or Ag, or Cd, or Mo, or Nb, or Zr, or Au, or Tc, or Pb, or Sn, or their alloys of the above mentioned heavy metal.

4. The memory cell of claim 1, wherein said non-magnetic heavy metal layer has the smallest possible cross section, allowed by wafer processes, around said memory cell to reduce the critical current or current density needed to switch said magnetic data storage layer.

5. The memory cell of claim 1, wherein said tunneling magnetoresistive (TMR) stack is a perpendicular TMR stack with the magnetization of its magnetic layers all orientating perpendicularly to their growth plane.

6. The memory cell of claim 5, wherein said memory cell further comprises an in-plane magnet with its magnetization fixed along the switching current direction, whose edge magnetic charge generates a magnetic bias field to said magnetic data storage layer along the switching current direction.

7. The memory cell of claim 6, wherein said in-plane magnet locates on the same side of the TMR stack with respect to the non-magnetic heavy metal layer.

8. The memory cell of claim 7, wherein said in-plane magnet is made of either a hard (or permanent) magnetic layer with a proper seed layer or a soft magnetic/antiferromagnetic bilayer, whose magnetization is fixed by the antiferromagnetic layer.

9. The memory cell of claim 6, wherein said in-plane magnet locates on the opposite side of the TMR stack and further away from said non-magnetic heavy metal layer compared with said magnetic stabilization layer.

10. The memory cell of claim 9, wherein said in-plane magnet, made of a soft magnetic/antiferromagnetic bilayer, whose magnetization is fixed by the antiferromagnetic layer, is separated from the magnetic stabilization layer by a non-magnetic layer and also acts as a soft underlayer for the magnetic stabilization layer to assist the creation of the complementary magnetic footprint of the data storage layer.

11. The memory cell of claim 6, wherein said in-plane magnet locates, either on top or at the bottom of the non-magnetic heavy metal layer, close to the TMR stack.

12. The memory cell of claim 11, wherein said in-plane magnet is made of either a hard magnetic layer with a proper seed layer or a soft magnetic/antiferromagnetic bilayer, whose magnetization is fixed by the antiferromagnetic layer.

13. The memory cell of claim 1, wherein said tunneling magnetoresistive (TMR) stack is a in-plane TMR stack with the magnetization of its magnetic layers all orientating within their growth plane normal to the in-plane cell writing current.

14. The memory cell of claim 13, wherein said in-plane TMR stack comprises an artificial antiferromagnetic reference layer typically made of ferromagnetic layer/Ru/ferromagnetic/antiferromagnetic, whose magnetization is set by the antiferromagnetic layer during magnetic field annealing.

15. The memory cell of claim 13, wherein said in-plane TMR stack comprises a magnetic storage layer containing thin $Ni_xFe$ layer (x varies from 5 to 95 atomic percentage) for inducing the anisotropy during field annealing as well as control the magnetostriction within said magnetic storage layer.

16. The memory cell of claim 15, wherein said magnetic storage layer is capable of generating, within the magnetic stabilization layer, its complementary magnetic footprint, whose magnetization is opposite to the magnetization of said magnetic storage layer to form a close magnetic flux loop to minimize or even totally cancel the magnetic flux emitting from the memory cell.

17. The memory cell of claim 1, wherein said memory cell with three connection ends—a read end, a write end, and a common end—is capable of forming a two dimensional (2D) memory array at a base plane (namely the level 1), over which multiple levels of memory arrays, with the same or closely similar to the cell arrangement of the level 1, stack together and are connected between different levels by level-link lines, connecting to the common ends of the memory cells at different levels but at the same vertical-projection location, to form a three dimensional (3D) memory array.

18. The memory cell of claim 17, wherein said common end of any one memory cell, within said base plane, links to an access transistor, whose gate electrode connects, by a conducting line (namely a Word-line existing only in level 1), to the gates of the other access transistors of the other memory cells on the same Word-line to form a word-column and controlled by cell access control electronics.

19. The memory cell of claim 17, wherein said write end and said read end of any one memory cell, within any one plane (or any one level), connects respectively to the correspondent ends of its adjacent memory cells by metallic lines (namely write-line and read-line respectively) normal to word-line of the level 1 in vertical projection view to form a row structure, which combines with the word-column of the level in vertical projection view to form the two dimensional (2D) memory array within any given plane.

20. The memory cell of claim 19, wherein said read-line is connected to read control electronics and read sensing voltage source, which enables sensing the memory cell by measuring output potential on the level-link line for any access-granted cell when needed, while said write-line is connected to write control electronics and write current source, which facilitates the flip of the data storage layer for any access-granted cell when needed.

* * * * *